United States Patent [19]
Yamanaka

[11] Patent Number: 5,998,862
[45] Date of Patent: *Dec. 7, 1999

[54] AIR-PACKED CCD IMAGES PACKAGE AND A MOLD FOR MANUFACTURING THEREOF

[75] Inventor: Hideo Yamanaka, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/526,145

[22] Filed: Sep. 5, 1995

Related U.S. Application Data

[63] Continuation of application No. 08/216,550, Mar. 23, 1994, abandoned.

[30] Foreign Application Priority Data

Mar. 26, 1993 [JP] Japan ................................ 5-068458

[51] Int. Cl.$^6$ ........................ H01L 23/08; H01L 31/0203; H01L 23/495; H01L 23/28
[52] U.S. Cl. ..................... 257/704; 257/666; 257/753; 257/787; 257/797; 257/434
[58] Field of Search .................... 257/704, 678, 257/680, 753, 666, 797, 787, 433, 434

[56] References Cited

U.S. PATENT DOCUMENTS

| | | | |
|---|---|---|---|
| 4,480,262 | 10/1984 | Butt | 257/704 |
| 4,814,943 | 3/1989 | Okuaki | 257/787 |
| 4,884,125 | 11/1989 | Miura | 257/704 |
| 5,016,084 | 5/1991 | Nakao | 257/704 |

*Primary Examiner*—Gene M. Munson
*Attorney, Agent, or Firm*—Hill & Simpson

[57] ABSTRACT

A plastic lid having a cavity portion is put to cover a pedestal from its front-surface side to its side-surface side, the pedestal having a semiconductor chip mounted thereon. An adhesive agent is charged into a space between the plastic lid and the pedestal so as to bond the plastic lid with the pedestal. Accordingly, a window frame is not necessary, corona discharge treatment or the like is not necessary, and it is therefore not necessary to use a B-stage thermosetting adhesive agent to thereby reduce the manufacturing cost of a semiconductor device of a hollow package structure having such a plastic lid. If a UV radiation setting adhesive agent or a visible radiation setting adhesive agent is used as the adhesive agent, cure time in bonding can be reduced.

10 Claims, 19 Drawing Sheets

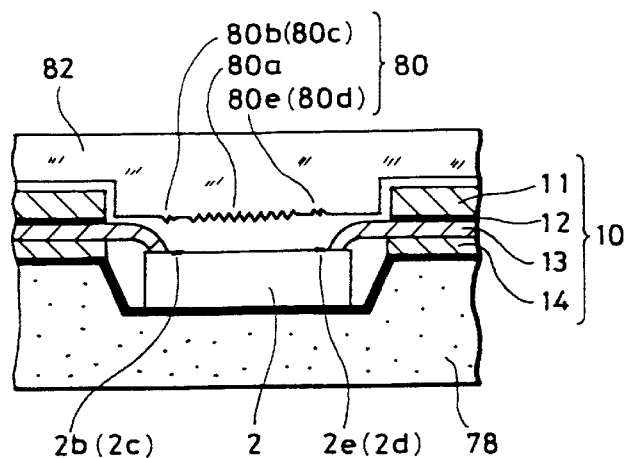
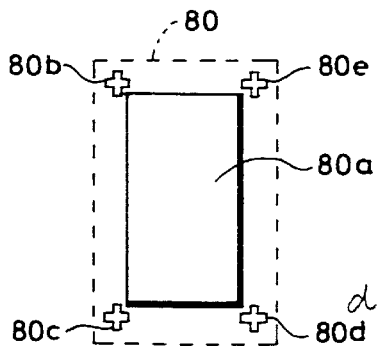
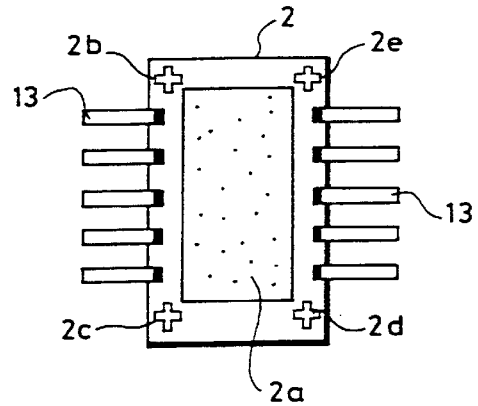
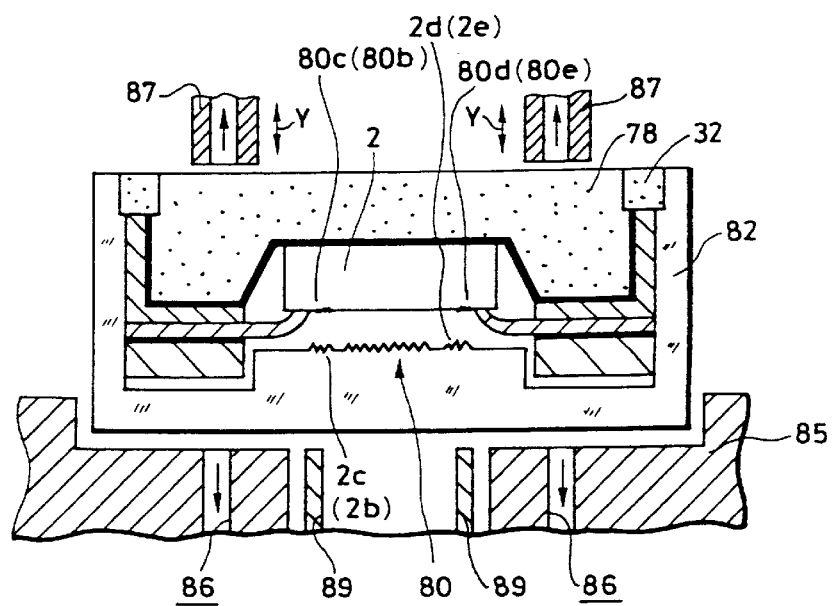
FIG. 16A
FIG. 16B
FIG. 16C
FIG. 16D

AIR-PACKED CCD IMAGES PACKAGE AND A MOLD FOR MANUFACTURING THEREOF

This is a continuation of application Ser. No. 08/216,550, filed Mar. 23, 1994, now abandoned.

BACKGROUND OF THE INVENTION

1. Field of the Invention

The present invention generally relates to a semiconductor device and a mold for manufacturing the same and, more particularly, is directed to a semiconductor device having a hollow package structure or the like, such as a CCD (charge-coupled device) area sensor integrated circuit, a CCD linear sensor integrated circuit, and so on, and a mold for manufacturing such a device.

2. Description of the Prior Art

Conventionally, in a semiconductor device having a solid-state image pickup device, such as a CCD linear sensor, a CCD area sensor or the like, a light transmissive member has been disposed so as to be opposite to an element formation surface (hereinafter simply referred to as "surface") of a semiconductor chip in order not only to protect the surface of the semiconductor chip but also to make light incident thereon. Plate glass is generally employed as such a light transmissive member.

FIG. 1 shows the sectional configuration of a conventional semiconductor device having a hollow package structure.

In the semiconductor device of FIG. 1, an inner lead of each lead frame 3 is wire-bonded with a wire 28 to a semiconductor chip 2 which is die-bonded onto a ceramic pedestal 1. A so-called window frame 4, which is a rectangular ring-like thin plate made of ceramic, is disposed and fixed to cover the surrounding of the inner leads. A rectangular transparent glass (hereinafter referred to as "cover glass" in accordance with connection) 5 is disposed and fixed onto the upper surface of the window frame 4. In this case, low melting-point glass 51 is used for providing a fixed connection between the pedestal 1 and the lead frames 3 and between the lead frames 3 and the window frame 4, and a thermosetting epoxy B-stage adhesive agent 6 is used for providing a fixed connection between the window frame 4 and the cover glass 5.

FIG. 2 shows the partially omitted sectional configuration of another conventional semiconductor device having a hollow package structure. In FIG. 2, parts the same as those in FIG. 1 are referenced correspondingly.

The semiconductor device of FIG. 2 has a tape 10 of a TAB (Tape Automated Bonding) system (hereinafter simply referred to as "TAB tape" in accordance with connection). This TAB tape 10 has, as well known, a four-layer structure of a polyimide base film 11, an adhesive agent 12, an inner lead 13 and a solder resist 14.

A wire is cut in a neck portion of a gold ball to form a gold bump on an aluminum (hereinafter abbreviated to "Al") pad on the surface of the semiconductor chip 2. This gold bump and the inner lead 13 of the TAB tape 10 are connected by gold-to-gold bonding (so-called single point bonding). Thereafter, the cover glass 5 is bonded to the base film 11 with a low-temperature-setting B-stage adhesive agent 7. The back of the semiconductor chip 2 is also sealed with resin 15.

A camera-incorporated VTR or the like, uses such a semiconductor device having a hollow package structure, in order to realize high performance operation, to reduce the size, weight and cost, and to improve the mechanical strength and accuracy.

To this end, recently, in the field of semiconductor device having a hollow package structure, investigation has been made as to possible production of the cover glass 5 with plastics (so-called transparent plastic lid which will be referred to hereinafter as "plastic lid") in order to attain improvement in optical characteristics, reduction in weight and in cost, and so on by improvement in the accuracy of attachment to a semiconductor chip.

However, with respect to the semiconductor device shown in FIG. 1, as a practical plastic material satisfying optical specification, there is no suitable adhesive agent other than amorphous polyolefine resin which has no polar radical. Therefore, it is necessary to perform surface treatment such as corona discharge treatment or the like upon a plastic lid made by such a material. As a result, production costs cannot be reduced. In addition, even if such bonding can be attained, there is one-digit difference in thermal expansion coefficient between the plastic lid and the ceramic pedestal 1. Therefore, there problems such as separation, and deterioration of air-tightness, and so on in temperature cycles occur, so that the development of practical plastic lids has not been possible.

Although bonding performed by an ultra-violet-ray (hereinafter abbreviated to "UV") radiation setting or a visible-ray radiation setting adhesive agent has been considered without using a thermosetting adhesive agent, these adhesive agents are generally in a liquid phase (A-stage). Therefore, gas released at the time of UV or visible light curing and at the time of after-baking adheres to the inside of a plastic lid in the hollow portion or an effective pixel region of the surface of a semiconductor chip such as a CCD area sensor or the like. Accordingly there has been a unevenness of sensitivity and deterioration of quality. Further, potential shift, discoloration of color filters and so on caused by charge-up of the semiconductor chip 2 at the time of UV radiation may occur.

On the other hand, in the semiconductor device shown in the example of FIG. 2, when the semiconductor chip 2 is sealed with the resin 15, it is possible that the semiconductor chip 2 may move while being sealed with the resin 15, in the case where the semiconductor chip 2 is, for example, a solid-state image pickup device such as a CCD linear sensor, a CCD area sensor or the like, because the number of the inner leads 13 connected to the semiconductor chip 2 is about 14. If the semiconductor chip 2 is moved, the surface of the semiconductor chip 2 is no longer parallel with the cover glass 5, so that the optical focus is no longer sharp which make the quality deteriorate or alternatively the inner leads may break off.

Moreover, in each of the semiconductor devices of FIGS. 1 and 2, α rays generated from impurities contained in the cover glass 5 acting as a lid are radiated onto the surface of the semiconductor chip 2, so that a dark current is produced in a solid-state image pickup device such as a CCD linear sensor, a CCD area sensor or the like due to so-called damage by the α rays. Particularly in the semiconductor device of FIG. 2, since the resin 15 exists on and above the surface of the semiconductor chip 2, a dark current is produced by α rays generated from glass beads mixed as filler in the resin 15.

OBJECTS AND SUMMARY OF THE INVENTION

It is therefore an object of the present invention to solve the foregoing problems in the prior art.

It is another object of the present invention to provide a semiconductor device which has a plastic lid and is superior in practical use.

It is a further object of the present invention to provide a semiconductor device which is superior in strength even if a TAB tape is used.

It is a still further object of the present invention to provide a semiconductor device in which damage due to α rays is not produced.

It is another object of the present invention to provide a semiconductor device in which potential shift and discoloration of color filters caused by charge-up does not occur even if UV radiation for curing.

It is another object of the present invention to provide a mold for manufacturing a semiconductor device, by which an integrally molded product of a plastic pedestal and lead frames superior in practical use can be molded.

As an aspect of the present invention, a semiconductor device having a hollow package structure is comprised of a pedestal with a semiconductor chip mounted on a front surface of the pedestal, lead frames with portions thereof disposed on the front surface of the pedestal, the portions being connected to the semiconductor chip electrically, and a plastic lid having a cavity portion and being arranged to cover the pedestal or the lead frames from front-surface side to side-surface side thereof so as to accommodate the semiconductor chip within the cavity portion, the plastic lid being bonded to the pedestal or the lead frame with an adhesive agent put into a space between the plastic lid and the pedestal or the lead frames in the state where the plastic lid is put on the pedestal or the lead frames.

As another aspect of the present invention, a semiconductor device having a hollow package structure is comprised of a pedestal and a semiconductor chip disposed respectively on opposite surfaces of a pressure sensitive adhesive double coated tape so as to be in opposition to each other, a tape of a TAB system bonded, through a base film or a solder resist, onto one of the opposite surfaces of the pressure sensitive adhesive double coated tape on which the semiconductor chip is bonded, the TAB system tape having an inner lead connected to a pad portion of the semiconductor chip, and a plastic lid having a cavity portion and being arranged to cover the pedestal or the pressure sensitive adhesive double coated tape from front-surface side to side-surface side thereof so as to accommodate the semiconductor chip within the cavity portion, the plastic lid being bonded to the pedestal or the pressure sensitive adhesive double coated tape with an adhesive agent put into a space between the plastic lid and the pedestal or the pressure sensitive adhesive double coated tape in the state where the plastic lid is put on the pedestal or the pressure sensitive adhesive double coated tape.

As a further aspect of the present invention, a semiconductor device is comprised of a pedestal having a cavity-like section, a semiconductor chip disposed on a front-surface side bottom portion of the pedestal, a tape of a TAB system bonded onto a front-surface side circumferential portion of the pedestal through a pressure sensitive adhesive double coated tape, the semiconductor chip being sealed by a thermoplastic resin or adhesive agent which is put on to fill around the semiconductor chip and hardened after an inner lead portion of the TAB system tape and a pad portion of the semiconductor chip are connected with each other through bonding.

As a further aspect of the present invention, a mold includes an upper mold and a lower mold for injection molding of an integrally molded product of a pedestal and lead frames in a semiconductor device having a hollow package structure and having a plastic lid, the integrally molded product having a structure in which portions of the lead frames disposed on the pedestal and connected to a semiconductor chip are inner lead surfaces, intermediate portions of the lead frames are buried in the pedestal, and outer lead portions are projected out of the pedestal to the outside, the upper and lower molds having a space portion formed therebetween so that the outer lead portions are sandwiched between the upper and lower molds in the space when the integrally molded product is formed by injection molding with the upper and lower molds, the space being tapered in an ascending direction inwardly from the outside of the molds so that the inner lead surfaces are brought into contact with an inner surface of the upper mold at the time of the injection molding.

According to the present invention, a plastic lid having a cavity portion is put on a pedestal on which a semiconductor chip is mounted, and an adhesive agent is charged into the space between the plastic lid and the pedestal to bond the plastic lid with the pedestal. Accordingly, no window frame is required. The plastic lid does not require corona discharge treatment or the like. Accordingly, it is not necessary to use a B-stage thermosetting adhesive agent, so that it is possible to manufacture a semiconductor device of a hollow package configuration having a plastic lid at a low cost. Since a window frame is not used, there is no problem with the characteristics of seal glass with respect to a semiconductor chip due to the inclination of the window frame. Accordingly it is possible to reduce the cost of the pedestal. For example, in the case of using a UV radiation setting adhesive agent or a visible radiation setting adhesive agent as the adhesive agent, it is possible to reduce cure time in bonding. UV radiation can be performed from a surface other than the surface of the semiconductor chip, for example, from the back surface. Accordingly, in the case where the semiconductor chip is an image pickup device such as a CCD area sensor or the like, it is possible to eliminate potential shift, discoloration of color filters and so on caused by charge-up due to the UV radiation.

Further according to the present invention, after a semiconductor chip and a pedestal are bonded respectively to the opposite surfaces of a pressure sensitive adhesive double coated tape so as to be opposite to each other, a TAB tape is bonded to the surface of the semiconductor chip through a base film or a solder resist, and inner leads are connected to the pad portion of the semiconductor chip. Further a plastic lid having a cavity portion is made to cover the pedestal on which the semiconductor chip is mounted, and an adhesive agent is charged into the space between the plastic lid and the pedestal to bond the plastic lid with the pedestal. Accordingly, it is possible to manufacture a semiconductor device of a hollow package configuration having a plastic lid superior in strength at a low cost even if a TAB tape is used. Moreover, as a result, the semiconductor chip and the inner lead and base film (or solder resist) of the TAB tape are bonded and fixed onto the pedestal, so that there is no case where the inner lead is broken, and there is no case where the parallelism between the surface of the semiconductor chip and the plastic lid is changed. Accordingly, for example, in the case where the semiconductor chip is a solid-state image pickup device such as a CCD area sensor or the like, it is possible to prevent deterioration of the sharpness of the optical focus. For example, when a UV radiation setting adhesive agent or a visible radiation setting adhesive agent is used as the adhesive agent, it is possible to reduce cure time in bonding. UV radiation can be performed from a surface other than the surface of the semiconductor chip, for example, from the back surface (actually, the back surface of the pedestal). Accordingly, in the case where the semiconductor chip is an image pickup device such as a CCD area sensor or the like, it is possible to eliminate potential shift, discoloration of color filters and so on due to charge-up caused by the UV radiation. The present invention also has an advantage in that it is possible to control the distance between the surface of the semiconductor chip and the inner surface of the plastic lid.

Further, according to the present invention, a semiconductor chip is disposed in a front-surface side bottom portion of a pedestal having a cavity-like section, and a TAB tape is put onto a front-surface side circumferential portion of the pedestal through a pressure sensitive adhesive double coated tape. The semiconductor chip is sealed by charging and setting a thermoplastic resin around the semiconductor chip after bonding inner lead portions of the TAB tape with pad portions of the semiconductor chip. Accordingly it is possible to manufacture a semiconductor device with a simple configuration. It is therefore possible to improve a heat radiation effect if a back-surface side bottom portion of the pedestal is attached to a patterned surface of a printed-circuit board or the like.

Further in a semiconductor device of a hollow package structure in which a plastic lid is bonded by an adhesive agent onto a lead-frame-incorporated pedestal molded by a mold according to the present invention, inner leads of the lead frames surely contact with an upper mold. Accordingly, there is no case where resin turns onto bonding surfaces of the inner leads. Thus, the semiconductor device has superior reliability. In addition, in the configuration where the surface of a semiconductor chip is disposed at a level higher than the bonding surface between the plastic lid and the pedestal, it is possible to prevent the performance of the semiconductor chip from being deteriorated due to α rays from the pedestal. Further, in the case where the surface of the semiconductor chip is disposed at a level lower than the bonding surface between the plastic lid and the pedestal, the plastic lid is partly interposed between the pedestal and the surface of the semiconductor chip. Accordingly in the same manner, it is possible to prevent the performance of the semiconductor chip from being deteriorated due to α rays.

BRIEF DESCRIPTION OF THE DRAWINGS

FIGS. 16A to 16D are schematic diagrams for explaining the positioning of a low pass filter in the sixth embodiment;

DETAILED DESCRIPTION OF THE PREFERRED EMBODIMENTS

Figure 1:
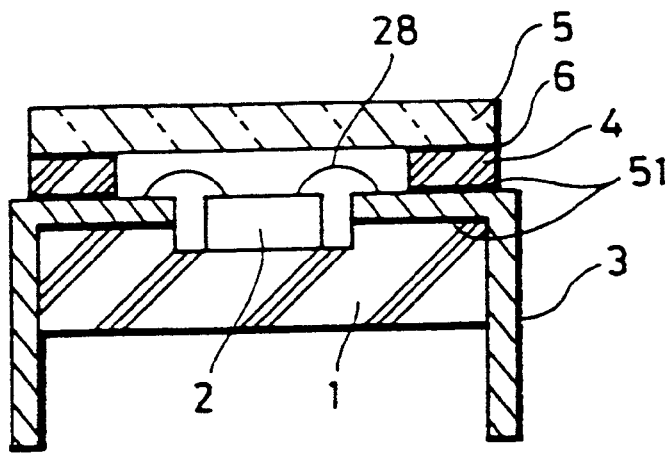
FIG. 1 is a schematic diagram illustrating the configuration of a conventional semiconductor device.

Referring to the drawings, the present invention will now be described below with reference to an embodiment of the semiconductor device formed as a solid image pickup device.

First Embodiment: Example of Seal with Adhesive Agent

FIGS. 3A to 3H show the process of forming a solid state image pickup device of the present invention.

Figure 3A:
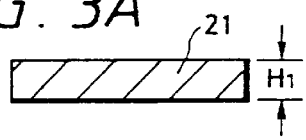
FIGS. 3A to 3H are process diagrams illustrating the configuration of a first embodiment of the semiconductor device according to the present invention and the process of forming of the same.

As shown in FIG. 3A, a rectangular parallelepiped pedestal 21 is prepared. The material of the pedestal 21 is selected from glass, ceramics, plastics and metal, and the thickness $H_1$ of the pedestal 21 is selected to be $H_1$=2 mm.

Figure 3B:
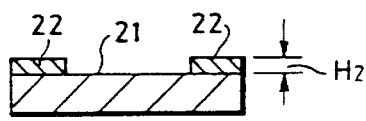

Then, as shown in FIG. 3B, an adhesive agent 22 is applied by screen printing onto each of the places where the lead frames 24 are to be fixed. A UV radiation setting adhesive agent, a visible radiation setting adhesive agent or a thermosetting adhesive agent may be used as the adhesive agent 22. The coating thickness $H_2$ of the adhesive agent 22 is selected to be not larger than the thickness $H_3$ of the lead frame (see FIG. 3C: $H_3$=0.2 to 0.25 mm). In the example of FIG. 3B, the thickness $H_2$ is selected to be in a range of from about 0.10 to about 0.15 mm.

Figure 3C:
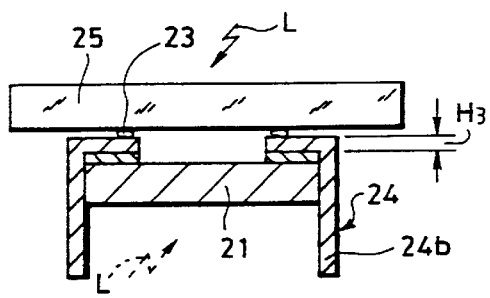

Then, as shown in FIG. 3C, lead frames 24 having Al cladding layers 23 respectively formed on inner leads 24a are disposed in the places where the adhesive agents 22 are applied by screen printing, and the lead frames 24 are fixed by a fixing jig 25 made of glass. Each lead frame 24 is formed of a 42-alloy material or a copper material and has an outer lead portion 24b plated with Sn or solder.

In the case where the adhesive agent 22 is a thermosetting adhesive agent, the adhesive agent is post-cured at about 150° C. for 1 to 2 hours while the lead frame 24 is fixed by the glass fixing jig 25 so that the lead frame 24 is fixed to the pedestal 21. In the case where the adhesive agent 22 is a UV radiation setting or visible radiation setting adhesive agent, UVL or visible light L is radiated from above the glass fixing jig 25 (in the case where the pedestal 21 is made of a light-transmission member such as glass, such light may be radiated from below the glass fixing jig 25) at the rate of from 1000 to 2000 $mJ/cm^2$. In the case where the UV radiation setting or visible radiation setting adhesive agent contains a thermosetting agent, the adhesive agent is further post-cured at about 100° C. for 2 hours or more. It is a matter of course that use of a light-transmissible fixing jig made of quartz glass is advantageous.

Figure 3D:
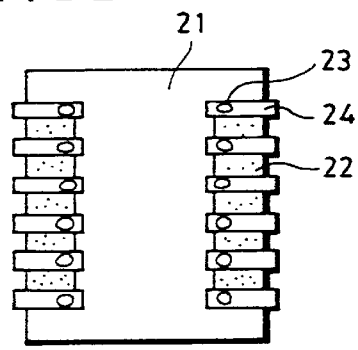

FIG. 3D shows a plan configuration of the pedestal 21 to which the lead frames 24 are fixed as described above.

Figure 3E:
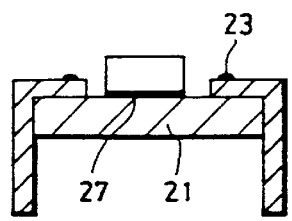

Then, as shown in FIG. 3E, a semiconductor chip 2 face up is die-bonded to the front surface of the pedestal 21 with insulating paste 27. The curing is carried out at about 100° C. for about 1 hour.

Figure 3F:
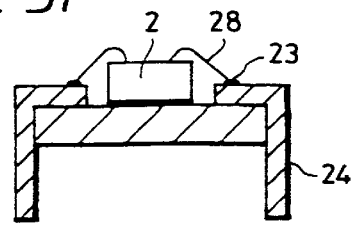

Then, as shown in FIG. 3F, the semiconductor chip 2 such as a CCD area sensor element, a CCD linear sensor element or the like and each of the Al cladding layers 23 on the respective lead frames 24 are wire-bonded to each other with a gold wire 28 having a diameter in a range of from 23 to 25 $\mu m\Phi$. The thickness of the semiconductor chip 2 is about 400 $\mu m$ and the temperature of a column at the time of wire bonding is about 100° C.

Figure 3G:
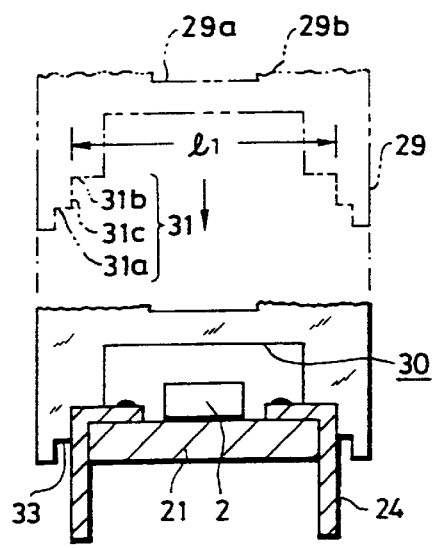

Then, as shown in FIG. 3G, a transparent plastic lid 29 is prepared to be put on the front surface side of the pedestal 21. The plastic lid 29 is made of an amorphous polyolefin resin and provided with a cavity portion 30. A two-step portion 31 constituted by a step portion 31a and another step portion 31b having a smaller inner size than the inner size of the step portion 31a is formed so as to be cut in a marginal portion of the cavity portion 30. As is obvious from FIG. 3F, the plastic lid 29 is put to cover the position where the step portion 31b strikes on corners of the lead frames 24. Accordingly, the horizontal surface of the step portion 31 is located in a level lower than the front surface of the semiconductor chip 2 in the condition in which the plastic lid 29 is put on (the thickness of the semiconductor chip 2 and the thickness of the lead frame 24 are 400 $\mu m$ and 0.25 mm, respectively). Even in the case where dust caused by rubbing is produced when the plastic lid 29 is put on, the dust is once reserved on the step portions 31c and 31b. A range of the plastic lid 29 corresponding to the front surface of the semiconductor chip 2 is formed as a light-transmission portion 29a, while the other range is formed as a light-non-transmission portion 29b.

Figure 3H:
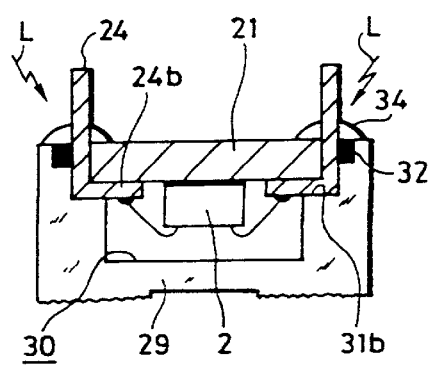

Then, as shown in FIG. 3H, the pedestal 21 is turned over in the condition in which the plastic lid 29 is put on. The inner size $l_1$ of the cavity portion 30 in the plastic lid 29 (inclusive of the inner size not shown in the drawing, that is, inclusive of the inner size in a direction perpendicular to the section of FIG. 3H: see FIG. 3G) is selected to be slightly smaller than the size of the pedestal 21 so that the plastic lid 29 does not drop down even in the case where the pedestal 21 is turned over. In this case, the plastic lid 29 is press-fitted to the pedestal 21.

In the condition in which the pedestal 21 is turned over, an adhesive agent 32 is applied to a gap 33 (see FIG. 3G) formed between the step portion 31a and the side surface portion of the pedestal 21. At this time, the adhesive agent 32 partly pours also into the step portion 31b. The adhesive agent 32 requires a coefficient of viscosity which is such that the adhesive agent 32 does not move from the step portion 31b side to the inner lead 24a side or in other words the adhesive agent 32 does not enter into the hollow portion. It is preferable that the coefficient of viscosity is selected to be in a range of from about 10000 to about 15000 CPS because the distance between the step portion 31c and the pedestal 21, that is, the thickness of the lead frame 24, is generally in a range of from about 0.2 to about 0.25 mm. As for the kind of the adhesive agent 32, a UV radiation setting or visible radiation setting adhesive agent may be used. The condition of radiation for curing of the adhesive agent is in a range of from about 1000 to about 2000 $mJ/cm^2$. Accordingly, the curing time of the UV radiation setting or visible radiation setting adhesive agent is relatively short compared with the curing time of the thermosetting adhesive agent. As shown in FIG. 3H, the direction of incidence of UVL or visible light L is from the pedestal 21 side (the back surface side of the semiconductor chip 2).

Because dust deposited on the step portion 31 is fixed by curing of the adhesive agent 32, poor performance of the semiconductor chip 2 caused by dust is eliminated. Further, because UV light is radiated from the back surface side of the pedestal 21, there is no radiation onto the front surface of the semiconductor chip 2. Accordingly, there is no potential for shifting due to charging-up, discoloration of a color filter, and so on, caused by UV radiation. Further, because the step portion 31 is located in a level lower than the front surface of the semiconductor chip 2 (see FIG. 3G), gas released at the time of curing of the adhesive agent 32 is prevented from entering into the hollow portion constituted by the cavity portion 30 as shown in FIG. 3H. As a result, it is possible to avoid irregularity of sensitivity and lowering of quality caused by deposition of released gas onto an effective pixel region in the front surface of the semiconductor chip 2. Alternatively, a moisture absorption setting adhesive agent may be used as the adhesive agent. Further, primer coating treatment may be carried out before the application of the adhesive agent in order to improve both adhesion and airtightness more greatly.

If necessary, a silicon RTV adhesive agent 34 as a sealing agent may be applied onto the adhesive agent 32 so as to be located around the lead frame 24.

Figure 4A:
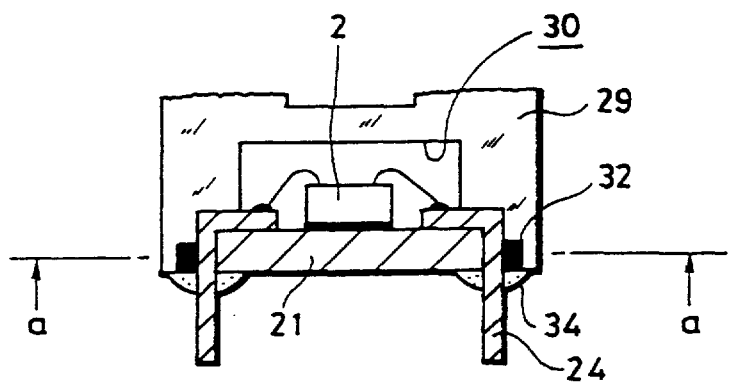
FIGS. 4A to 4C are schematic diagrams illustrating the configuration of the finished product of the first embodiment and the plan view thereof.
Figure 4B:
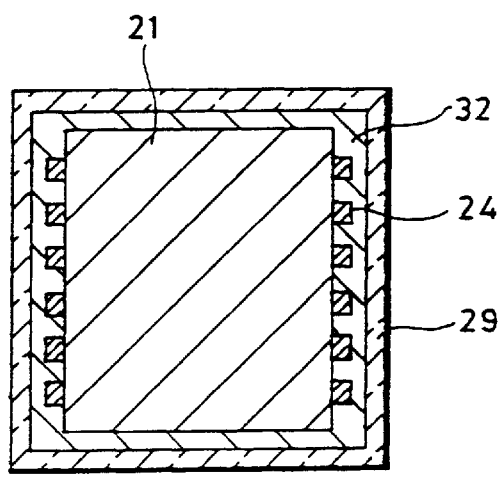
Figure 4C:
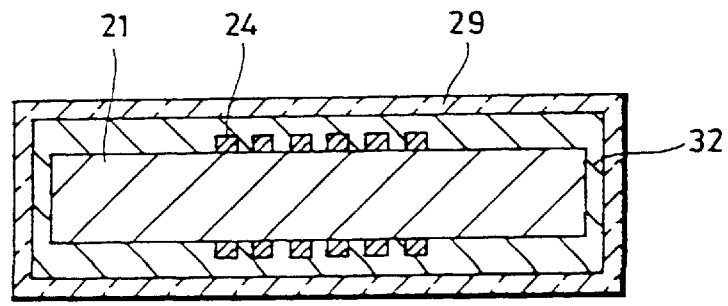

FIG. 4A shows a semiconductor device as a finished product obtained by returning the inverted semiconductor device shown in FIG. 3H to an upright position. FIG. 4B shows a sectional configuration taken along the line a—a, of the semiconductor device as a finished product in the case where the semiconductor chip 2 is a CCD area sensor element. FIG. 4C shows a sectional configuration like the configuration shown in FIG. 4B, of the semiconductor device as a finished product in the case where the semiconductor chip 2 is a CCD linear sensor element.

As described above, in the example of FIGS. 3A to 3H, a pedestal 21 on which a semiconductor chip 2 is disposed is covered with a plastic lid 29 having a cavity portion 30, and an adhesive agent 32 is applied to a gap 33 between the plastic lid 29 and the pedestal 21 so that the plastic lid 29 is bonded to the pedestal 21 with the adhesive agent 32. Accordingly, such a window frame as shown in the description of the prior art is not required and at the same time corona discharge treatment or the like is not required, so that use of the B-stage thermosetting adhesive agent is avoided. As a result, a hollow package structure semiconductor device having a plastic lid can be produced at low cost.

Figure 5A:
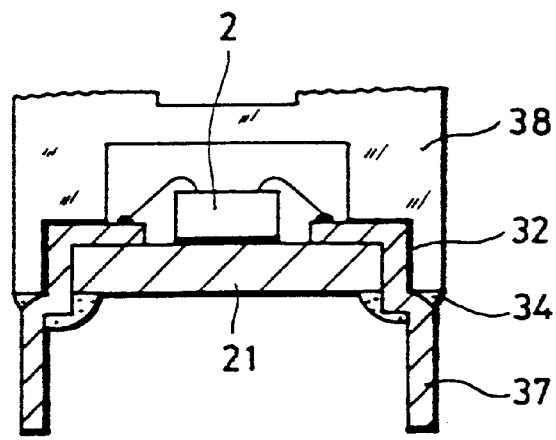
FIGS. 5A to 5C are schematic diagrams illustrating the configuration of a modified example of the first embodiment.
Figure 5B:
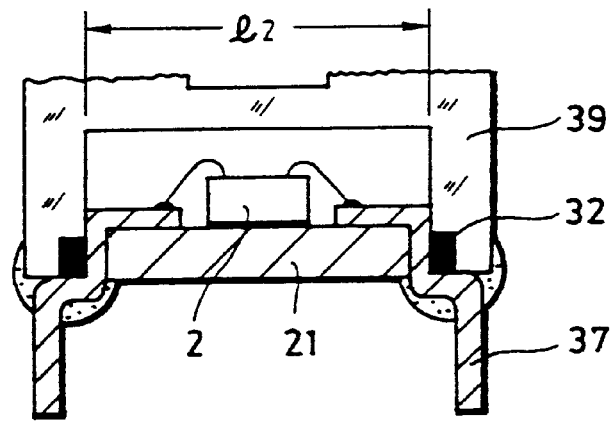
Figure 5C:
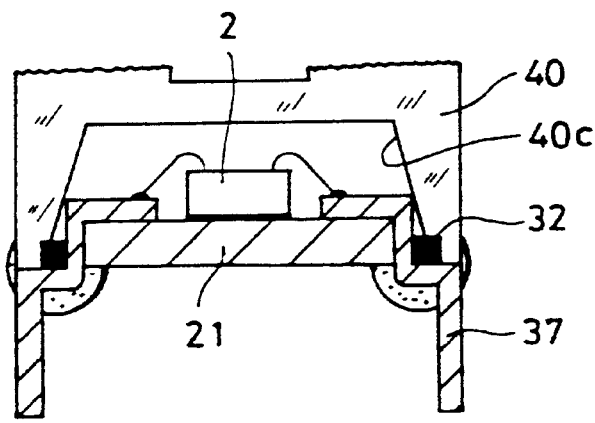

FIGS. 5A to 5C show modified examples of the semiconductor device shown in FIGS. 3A to 3H (FIGS. 4A to 4C).

In each of FIGS. 5A to 5C, a bent lead frame 37 is used so that plastic lids 38 to 40 are supported by a bent portion of the lead frame 37.

In the example of FIG. 5A, a plastic lid 38 having a step portion located in one place is used. In the example of FIG. 5B, a plastic lid 39 having a cavity portion having the inner size $l_2$ selected to be substantially equal to the size of the pedestal is used. In the example of FIG. 5C, a plastic lid 40 having a taper 40c formed in the side of the cavity portion is used. In the example of FIG. 5C, the taper 40c is used for positioning of the plastic lid 40.

Except the peculiar effects, the same effect as in the aforementioned example shown in FIGS. 3A to 3H can be obtained in the examples of FIGS. 5A to 5C.

Second Embodiment: Another Example of Seal with Adhesive Agent

In this second embodiment, a super small-size CCD solid image pickup device having an external diameter in a range of from 5 to 8 mmΦ is formed.

FIGS. 6A to 6G show a process of forming the solid image pickup device of the second embodiment and a configuration thereof. In the example of FIGS. 6A to 6G, the parts the same as or equivalent to those in the example of FIG. 1, the example of FIG. 2 and the examples of FIGS. 3A to 5C are referenced correspondingly and the detailed description of those parts will be omitted. Also in various embodiments which will be described later after the second embodiment (after the example of FIGS. 6A to 6G), the parts the same as or equivalent to those in the preceding embodiments are referenced correspondingly and the detailed description of those parts will be omitted.

Figure 6A:
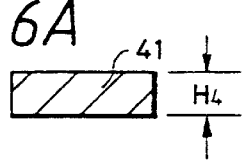
FIGS. 6A to 6G are process diagrams illustrating the configuration of a second embodiment and a modified example thereof, and the process of formation of the second embodiment.

As shown in FIG. 6A, a rectangular parallelepiped or cylindrical pedestal 41 is prepared first. The material of the pedestal 41 is selected from glass, ceramics, plastics and metal, and the thickness $H_4$ of the pedestal 41 is selected to be $H_4$=about 2 mm.

Figure 6B:
Figure 6C:
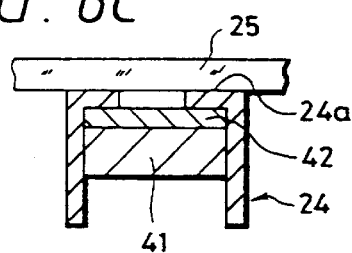

Then, as shown in FIG. 6B, the whole of a front surface of the pedestal 41 is coated with an epoxy resin 42 having a thickness in a range of from 0.1 to 0.15 mm. In this case, no mask for screen printing is required because the whole surface is coated.

Then, as shown in FIG. SC, inner leads 24a of lead frames 24 are disposed so as to overlap the epoxy resin 42 and are pressed by a fixing jig 25 made of glass. In this condition, the resin 42 is hardened by baking at a temperature of 150 to 160° C. for 3 to 5 hours so that the lead frames 24 are joined/fixed to the pedestal 41. In the case where the material for the pedestal 41 is metal, the greatest care must be taken so that the lead frames 24 do not touch the pedestal 41.

Figure 6D:
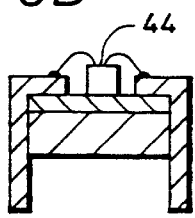

Then, as shown in FIG. 6D, a semiconductor chip 44 is die-bonded and then wire bonding is carried out.

Figure 6E:
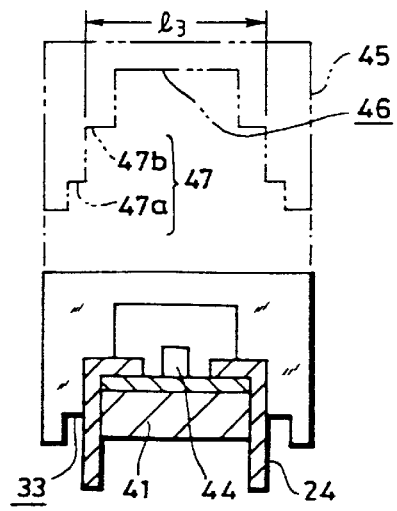

Then, as shown in FIG. 6E, a transparent plastic lid 45 is prepared so as to be put from the front surface side of the pedestal 41. The plastic lid 45 is made of an amorphous polyolefin resin and provided with a cavity portion 46. In the case that the pedestal 41 is shaped like a rectangular parallelepiped, the cavity portion 46 is shaped like a rectangular parallelepiped corresponding to the shape of the pedestal 41. In the case where the pedestal 41 is shaped like a cylinder, on the other hand, the cavity portion 46 is shaped like a cylinder corresponding to the shape of the pedestal 41. The inner size $l_3$ of the plastic lid 45 is selected to be slightly smaller than the size of the pedestal 41. This is because the plastic lid 45 is prevented from falling off from the pedestal 41 when the plastic lid 45 is turned over after it is put on.

A two-step portion 47 constituted by a step portion 47a and a step portion 47b which is smaller in size than the step portion 47a is formed so as to be cut in a marginal portion of the cavity portion 46. As is obvious from FIG. 6E, the plastic lid 45 is put on to cover the position where the step portion 47b strikes on corners of the lead frame 24. Accordingly, the horizontal surface of the step portion 47 is located in a level lower than the front surface of the semiconductor chip 44.

Then, the pedestal 41 is turned over in the condition that the plastic lid 45 is put on (the state that the pedestal 41 is turned over is not shown but the same as shown in FIG. 3H).

In the condition in which the pedestal 41 is turned over as described above, an adhesive agent 32 is applied to a gap 33 formed between the step portion 47a and the side surface portion of the pedestal 41. At this time, the adhesive agent 32 partly pours also into the step portion 47b. As for the kind of the adhesive agent 32, a UV radiation setting or visible radiation setting adhesive agent may be used. The condition of radiation for curing the adhesive agent is from about 1000 to 2000 mJ/cm². Accordingly, the curing time of the UV radiation setting or visible radiation setting adhesive agent is relatively short compared with the curing time of the thermosetting adhesive agent.

Figure 6F:
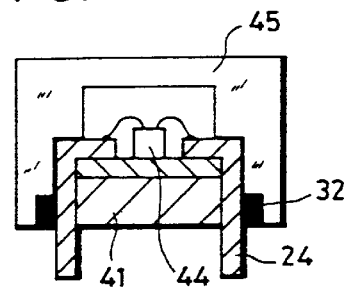

FIG. 6F shows the configuration of the semiconductor device as a finished product after hardening of the adhesive agent 32.

Figure 6G:
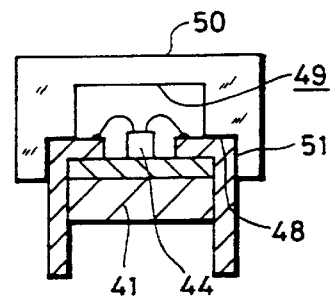

FIG. 6G shows a modified example of the semiconductor device shown in FIG. 6F. In this example, an epoxy adhesive agent is used while the curing time is elongated as will be described later. The process of forming the semiconductor device shown in FIG. 6G is the same as the process of forming the semiconductor device shown in FIG. 6F, in the steps up to the step shown in FIG. 6D. In the example of FIG. 6G, a transparent plastic lid 50 having a cavity portion 49 provided with a one-step portion 48 is prepared so as to be put on the pedestal 41 side by press-fitting. The step portion 48 is subjected to surface treatment by corona discharging in advance. The pedestal 41 covered with the plastic lid 49 is turned over and an epoxy low-temperature setting adhesive agent 51 (not shown) is put into a gap. The curing condition for hardening the adhesive agent 51 is a temperature of 80 to 100° C. and time for about 3 hours.

Also in the examples of FIGS. 6A to 6G, it is possible to sweep away: the aforementioned defective performance of the semiconductor chip 44 caused by dust; the disadvantages such as potential shifting due to charging-up, decoloration of a color filter, and so on, caused by UV radiation; the entrance of released gas into the hollow portion at the time of hardening the adhesive agents 32 and 51; the irregularity of sensitivity and the lowering of quality of the semiconductor chip 44 caused by the entering of released gas; and so on. Further, because plastic lids 45 having cavity portions 46 and 49 respectively are used, such a window frame as used in the prior art is not required. As a result, a hollow package structure semiconductor device having a plastic lid can be produced at low cost.

Third Embodiment: Example of Seal with Resin

FIGS. 7A to 7H show a process of forming a solid image pickup device of the third embodiment and a configuration thereof.

Figure 7A:
FIGS. 7A to 7H are process diagrams illustrating the configuration of a third embodiment and the process of forming of the same.

As shown in FIG. 7A, a rectangular parallelepiped pedestal 41 is prepared first. The material of the pedestal 41 is selected from glass, ceramics, plastics and metal, and the thickness H is about 2 mm.

Figure 7B:
Figure 7C:
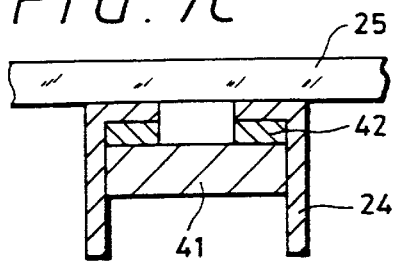

Then, as shown in FIG. 7B, the whole of a marginal portion of a front surface of the pedestal 41 is coated by screen printing with a relatively-high-temperature-purpose epoxy resin 42 having a thickness in a range of from 0.10 to 0.15 mm Then, as shown in FIG. 7C, lead frames 24 are disposed so as to overlap the epoxy resin 42 and is pressed by a fixing jig 25. In this condition, the resin 42 is baked at a temperature in a range of from 150 to 160° C. for 3 to 5 hours so that the lead frames 24 are joined/fixed to the pedestal 41.

Figure 7D:
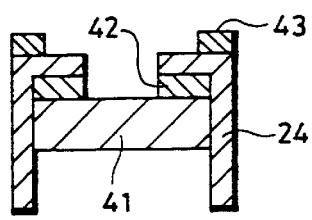
Figure 7E:
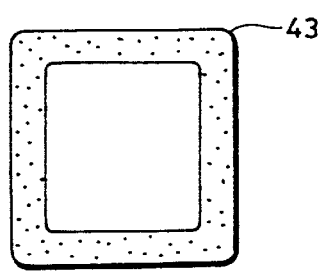
Figure 7F:
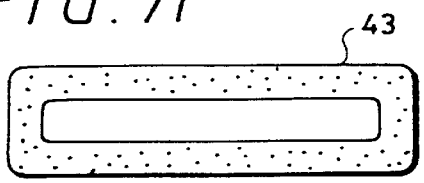

Then, as shown in FIG. 7D, if necessary, the whole circumference (the plan view in the case where the semiconductor chip 2 is a CCD area sensor being shown in FIG. 7E, and the plan view in the case where the semiconductor chip 2 is a CCD linear sensor being shown in FIG. 7F) except the Al cladding layer (not shown) for wire bonding on the lead frames 24 on the front surface of the pedestal 41 is coated by screen printing again with a resin layer 43 having a thickness of 0.4 mm by screen printing again. The temperature for baking the resin 43 is preferably selected to be lower than the temperature for baking the resin 42.

After the surface subjected to screen printing is made uniform, the resin layer 43 is baked. After the resin layer 43 is baked, the surface of the resin layer 43 may be polished in accordance with the necessity of high precision or the like to form suitable flatness (consequently to form parallelism between the lid and the front surface of the semiconductor chip). In the step of FIG. 7D, the lower portion of each lead frame 24 may be preferably fixedly held to prevent positional displacement and gating when baking is performed.

Figure 7G:
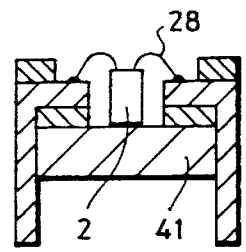

Then, as shown in FIG. 7G, the semiconductor chip 2 is die-bonded onto the pedestal 41 and wire bonding with a gold wire 28 is then performed.

Figure 7H:
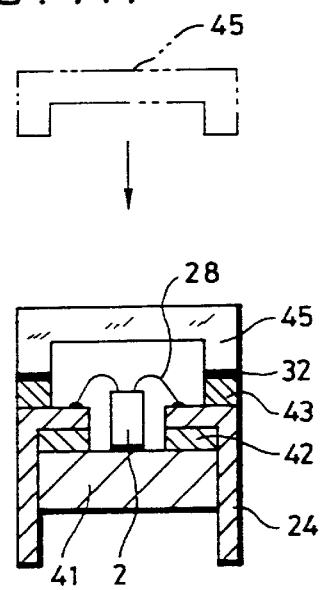

Then, as shown in FIG. 7H, a plastic lid 45 is prepared and an adhesive agent 32 is applied to a gap between the resin 43 and the plastic lid 45 to bond the plastic lid 45 to the pedestal 41. As for the kind of the adhesive agent 32, a UV radiation setting or visible radiation setting adhesive agent may be used. The condition of radiation for curing the adhesive agent is in a range of from about 1000 to about 2000 mJ/cm$^2$. Accordingly, the curing time of the UV radiation setting or visible radiation setting adhesive agent is relatively short compared with the curing time of the thermosetting adhesive agent. Alternatively, an epoxy low-temperature setting adhesive agent (a temperature range of from 85 to 100° C. and 3–5 hours) may be used. In the case where this adhesive agent is used when the plastic lid 45 is made of amorphous polyolefin plastics, corona discharging is carried out in advance. Alternatively, an amorphous polyolefin plastic lid subjected to corona discharging to form a B-stage epoxy or acryl low-temperature setting adhesive agent layer may be used.

Figure 8A:
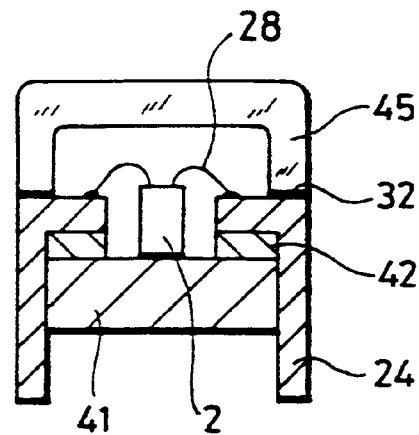
FIGS. 8A to 8C are schematic diagrams illustrating the configuration of a modified example of the third embodiment.
Figure 8B:
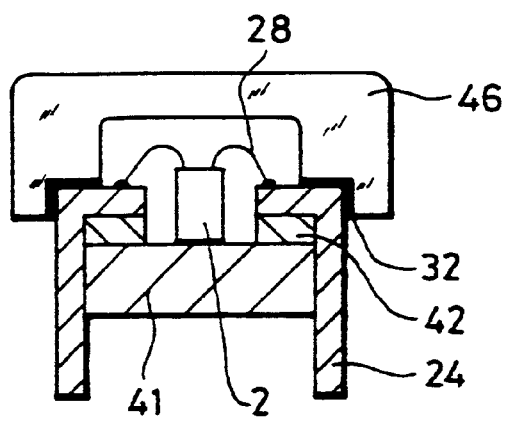
Figure 8C:
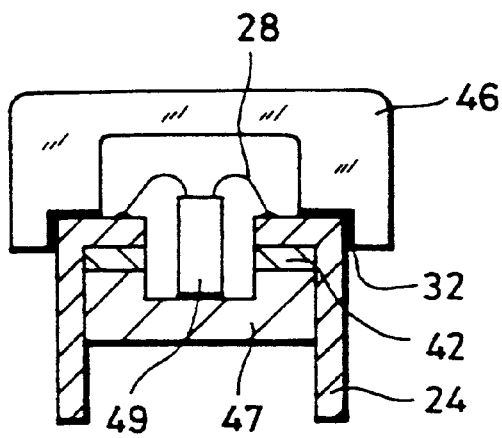

FIGS. 8A to 8C show modified examples of the semiconductor device (solid state image pickup device) shown in FIG. 7H. In each of the semiconductor devices shown in FIGS. 8A to 8C, the step of FIG. 7D is omitted so that the resin layer 43 is not formed. The example of FIG. 8A is the same as the example of FIG. 7H except that the resin layer 43 is not formed in the example of FIG. 8A. FIG. 8B shows an example where a plastic lid 46 having a step portion is used. FIG. 8C shows an example where the pedestal 41 is replaced by a pedestal 48 having a cavity portion 47. The reason why the cavity portion 47 is provided is in that a thick (600 μm) semiconductor chip 49 is used. By the provision of the cavity portion 47, the gold wire 28 is prevented from touching the edge of the semiconductor chip 49 when wire bonding is performed.

In the examples shown in FIGS. 7A to 7H and FIGS. 8A to 8C, no window frame is used. Accordingly, a semiconductor device (solid state image pickup device) can be produced at low cost.

Fourth Embodiment: Example of Ceramic Pedestal

FIGS. 9A to 9I show a process of forming a solid image pickup device of the fourth embodiment and a configuration thereof.

Figure 9A:
FIGS. 9A to 9I are process diagrams illustrating the configuration of a fourth embodiment and a modified example thereof, and the forming process of the fourth embodiment.

As shown in FIG. 9A, a rectangular parallelepiped pedestal 50 made of ceramics and having a thickness of about 2 mm is prepared first.

Figure 9B:
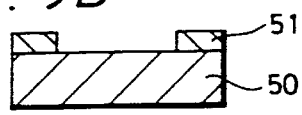

Then, as shown in FIG. 9B, the whole circumference of a marginal portion of a front surface of the pedestal 50 is coated by screen printing with low melting point glass 51 to form a coating thickness in a range of from 0.10 to 0.15 mm.

Figure 9C:
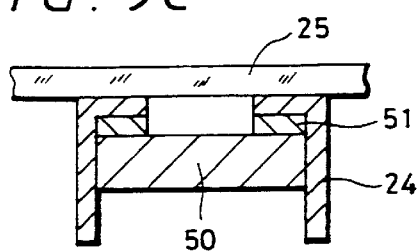

Then, as shown in FIG. 9C, lead frames 24 are disposed so as to overlap the low melting point glass 51 and is pressed by a fixing jig 25. In this condition, the low melting point glass 51 is heated in the baking condition in a range of from 480 to 500° C. so as to be melted, so that the pedestal 50 is fixed to the lead frames 24.

Figure 9D:
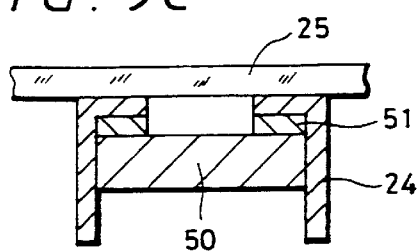
Figure 9E:
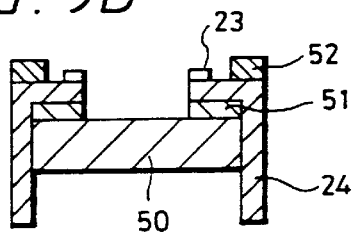

Then, as shown in FIG. 9D, the whole circumference (the plan view being shown in FIG. 9E in the case where the semiconductor chip 2 is a CCD area sensor, and the plan view being shown in FIG. 9F in the case where the semiconductor chip 2 is a CCD linear sensor) except the Al cladding layers 23 on the lead frames 24 on the front surface of the pedestal 50 are coated by screen printing again with a low melting point glass layer 52 having a thickness in a range of from 0.25 to 0.30 mm. The temperature for baking the low melting point glass layer 52 is preferably selected to be lower than the temperature for baking the low melting point glass 51.

After the surface subjected to screen printing is made uniform, the low melting point glass layer 52 is baked at a temperature in a range of from 400 to 430° C. After baking, the surface of the low melting point glass layer 52 may be polished in accordance with the necessity of high precision or the like to form suitable flatness (consequently to form parallelism between the lid and the front surface of the semiconductor chip). In the step of FIG. 9D, the respective lower portions of the lead frames 24 are fixedly held. In the case where the aforementioned parallelism and airtightness are not required so strictly, the low melting point glass layer 52 may be omitted.

Figure 9F:
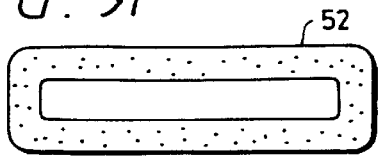
Figure 9G:
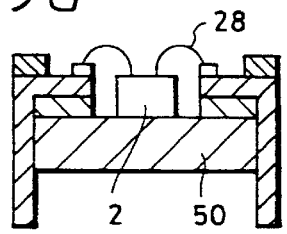

Then, as shown in FIG. 9G, the semiconductor chip 2 is die-bonded onto the pedestal 50 and wire bonding with a gold wire 28 is then performed.

Figure 9H:
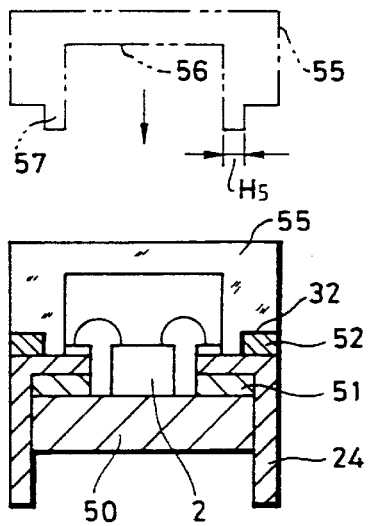

Then, as shown in FIG. 9H, a plastic lid 55 is prepared and an adhesive agent 32 is applied to a gap between the low melting point glass layer 52 and the plastic lid 55 to bond the plastic lid 55 to the pedestal 50. As for the kind of the adhesive agent 32, a UV radiation setting or visible radiation setting adhesive agent may be used. The condition of radiation for curing the adhesive agent is in a range of from 1000 to 2000 mJ/cm$^2$. Accordingly, the curing time of the UV radiation setting or visible radiation setting adhesive agent is relatively short compared with the curing time of the thermosetting adhesive agent.

Alternatively, a B-stage epoxy low-temperature setting adhesive agent (at a temperature in a range of from 85 to 100° C. for 3 to 5 hours) may be used. In the case where this adhesive agent is used when the plastic lid 55 is made of amorphous polyolefin plastics, corona discharging is carried out in advance. Further, a projection portion 57 is formed along the whole circumference of an inner marginal portion of the cavity portion 56 of the plastic lid 55. The thickness of the projection portion 57 is preferably selected to be not smaller than 0.1 mm. In this case, it is important to determine the height size of the projection portion 57 so that the projection portion 57 is brought into contact with the lead frames 24 to shield α rays generated from the low melting point glass layer 52 and the adhesive agent 32. By the provision of the projection portion 57, α regenerated from the low melting point glass layer 52 and the adhesive agent 32 are shielded, so that the front surface of the semiconductor chip 2 is prevented from being damaged by α rays. Because the low melting point glass 51 is located at a level lower than the front surface of the semiconductor chip 2, α rays are prevented from being radiated onto the front surface of the semiconductor chip 2 even in the case where α rays are generated.

As described above, in the example of FIGS. 9A to 9I, the window frame shown in the description of the prior art is not used. Accordingly, even in the case where a pedestal 50 made of ceramics is used, a semiconductor device having a hollow package structure can be produced at low cost.

Figure 9I:
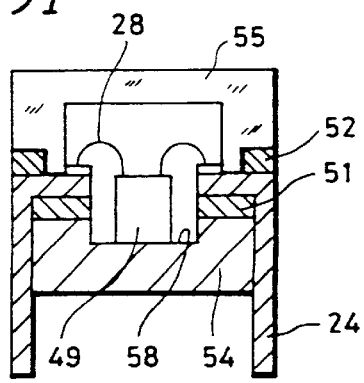

FIG. 9I shows the configuration of a modified example of the semiconductor device shown in FIG. 9H. In the example of FIG. 9I, the pedestal 50 of FIG. 9H is replaced by a pedestal 54 having a cavity portion 58. FIG. 9I shows an example where a thick (600 μm) semiconductor chip 49 is used. By the provision of the configuration as shown in FIG. 9I, the gold wire 28 is prevented from touching the edge of the semiconductor chip 49 at the time of wire bonding.

Fifth Embodiment: Example of TAB Method

Figure 10A:
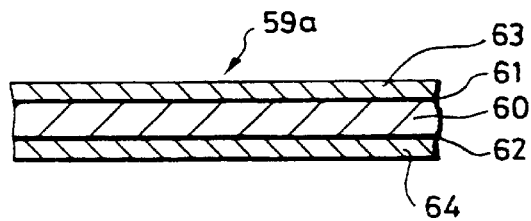
FIGS. 10A to 10C are schematic diagrams illustrating the configuration of a pressure sensitive adhesive double coated tape for a fifth embodiment and an example of working on the same.
Figure 10B:
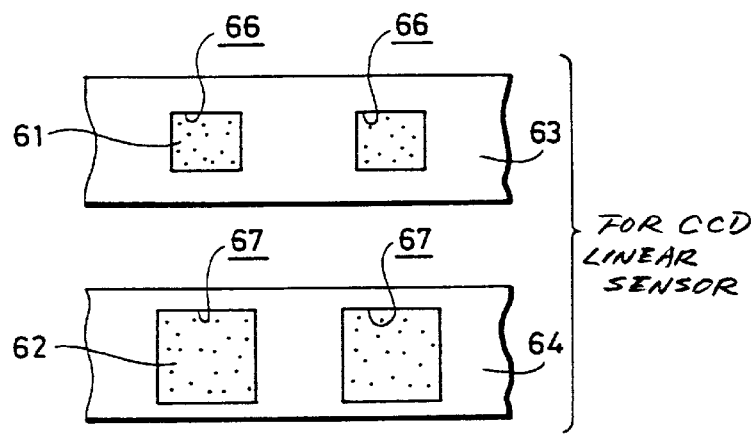
Figure 10C:
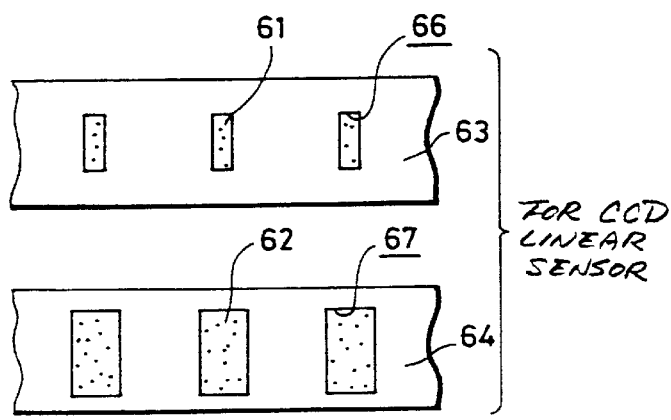

FIGS. 10A to 10C show examples of the configuration of a pressure sensitive adhesive double coated tape which is to be used for forming a semiconductor device (solid state image pickup device) according to the fifth embodiment or the like.

FIGS. 11A to 11F show a process of forming the semiconductor device of the fifth embodiment.

FIG. 10A shows a sectional configuration of a pressure sensitive adhesive double coated tape 59a which is used generally. As is well known, the pressure sensitive adhesive double coated tape 59a has a base film 60 having front and back surfaces coated with adhesive agent layers 61 and 62 respectively and further provided with release sheets 63 and 64 bonded to the outside of the adhesive agent layers 61 and 62 respectively.

As shown in FIG. 10B (in the case that the semiconductor chip 2 is a CCD area sensor or the like) or as shown in FIG. 10C (in the case that the semiconductor chip 2 is a CCD line sensor or the like), openings 66 in accordance with the size of the semiconductor chip 2 are first formed in the release sheet 63 on the front surface side of the pressure sensitive adhesive double coated tape 59a and openings 67 in accordance with the size of the pedestal 21 are formed in the release sheet 64 on the back surface side of the pressure sensitive adhesive double coated tape 59a. The adhesive agent layers 61 and 62 are exposed in the places where the openings 66 and 67 are formed.

Figure 11A:
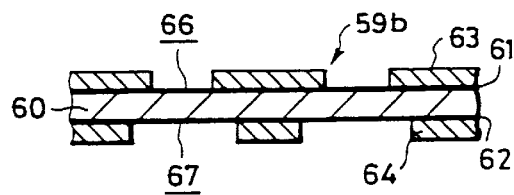
FIGS. 11A to 11F are process diagrams illustrating the configuration of the fifth embodiment and a modified example thereof, and the forming process of the fifth embodiment.

FIG. 11A shows a sectional configuration of a pressure sensitive adhesive double coated tape (designated by reference numeral 59b) having openings 66 and 67 formed.

Figure 11B:
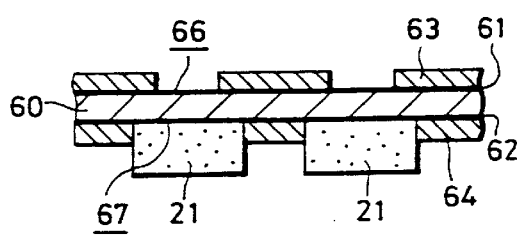

Then, as shown in FIG. 11B, pedestals 21 are pressed against the adhesive agent layer 62 through the openings 67 on the back surface side of the pressure sensitive adhesive double coated tape 59b so that the pedestals 21 are bonded to the base film 60. Any material, for example, glass, ceramics, plastics, metal or the like, may be used as a material for the pedestals 21.

Figure 11C:
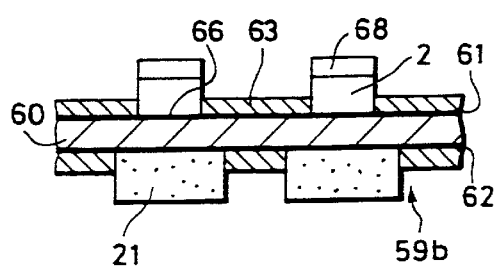
Figure 11D:
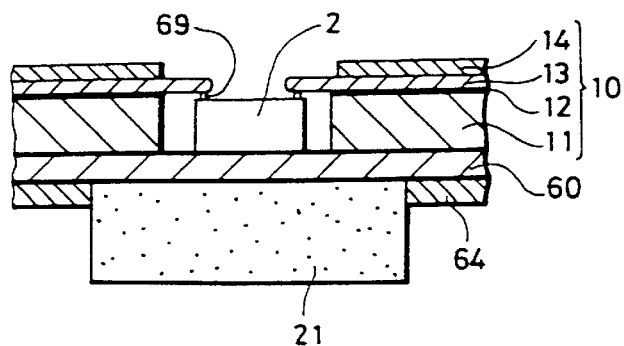

Then, as shown in FIG. 11C, semiconductor chips 2 each of which has a surface-protection UV radiation setting tape 68 bonded to its front surface are pressed to the adhesive agent layer 61 through the openings 66 on the front surface side of the pressure sensitive adhesive double coated tape 59b by using a flat collet or the like so that the semiconductor chips 2 are bonded to the base film 60.

In the case that the adhesive agent layers 61 and 62 are short of adhesion, a low temperature setting adhesive agent (curing at about 85° C. for about 1 hour) or a UV radiation setting or visible radiation setting adhesive agent as described above may be used if necessary.

Then, as shown in FIG. 1D, which shows respective constituent elements of FIG. 11C enlarged by a suitable magnifying power, the release sheet 63 on the semiconductor chip 2 side is released and at the same time the UV radiation setting tape 68 is also released. Of a TAB method tape 10 (hereinafter referred to as "TAB tape" simply when occasion demands), the one-end side of a base film 11 is bonded to the adhesive agent layer 61 from which the release sheet 63 has been released. Then, inner leads 13 are bonded to respective Al pad portions of the semiconductor chips 2 through bumps 69 by single point bonding. According to the technique of signal point bonding, the inner leads 13 can be joined one by one securely. Alternatively, the inner leads 13 may be joined by a low-temperature gang point technique or a laser bonding technique. As is well known, the TAB tape 10 has a four-layer structure composed of a layer of the base film 11, a layer of a solder resist 14, a layer of an adhesive agent 12 and a layer of the inner leads 13.

Figure 11E:
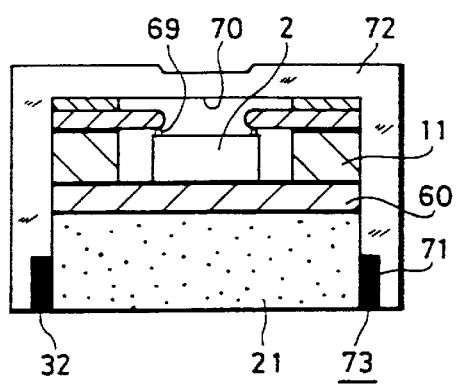

Then, as shown in FIG. 11E, the TAB tape 10 is cut in accordance with the size of individual pedestal 21. Then, a plastic lid 72 having a cavity portion 70 and a cut step portion 71 is press-fitted to the pedestal 21 so as to cover the pedestal 21. Then, the pedestal 21 covered with the plastic lid 72 is turned over and an adhesive agent 32 is applied to a gap 73 between the step portion 71 and the side portion of the pedestal 21. As for the kind of the adhesive agent 32, a UV radiation setting or visible radiation setting adhesive agent may be used. The condition of radiation for curing the adhesive agent is in a range of from 1000 to 2000 mJ/cm². Accordingly, the curing time of the UV radiation setting or visible radiation setting adhesive agent is relatively short compared with the curing time of the thermosetting adhesive agent.

Figure 11F:
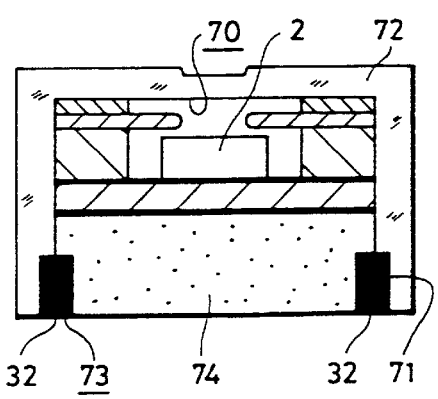

FIG. 11F shows a configuration of a modified example of the semiconductor device shown in FIG. 11E. The semiconductor device of FIG. 11F is formed by replacing the pedestal 21 of the semiconductor device of FIG. 11E by a pedestal 74 having a notch 73 formed in a position corresponding to the step portion 71 of the plastic lid 72.

Figure 12A:
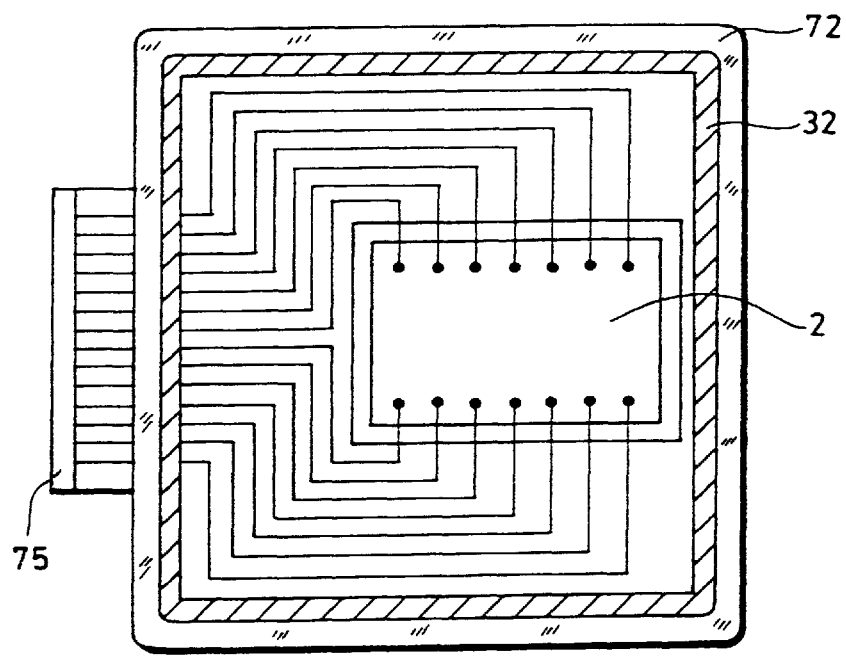
FIGS. 12A and 12B are schematic diagrams illustrating a partially omitted perspective plane configuration of the fifth embodiment.
Figure 12B:
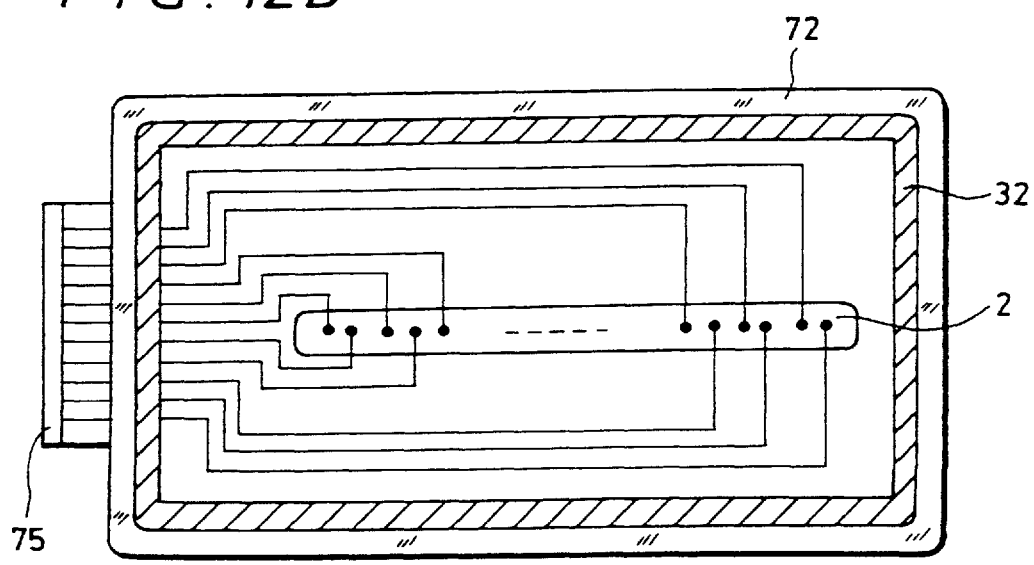

FIGS. 12A and 12B are partly transmissive views, viewed from the bottom, of important part of the semiconductor device of FIG. 9F in the case where the semiconductor chip 2 is a CCD area sensor (FIG. 12A) and in the case where the semiconductor chip 2 is a CCD linear sensor (FIG. 12B). It is apparent from each of FIGS. 12A and 12B that the semiconductor device has a connection terminal portion (outer lead portion) 75 such as a soldered portion, a connector portion, or the like. In each case, the connection terminal portion 75 is led out to one side (one-directional side) of the quadrilateral semiconductor device. Accordingly, not only the semiconductor is simple in configuration but the semiconductor device can be mounted onto a printed wiring substrate or the like easily.

FIGS. 13A to 13E show a process of forming a modified example of the semiconductor device shown in FIG. 11E and a configuration thereof. The steps shown in FIGS. 13A to 13E correspond to the steps shown in FIGS. 11A to 11E and therefore need not be described in detail.

Figure 13A:
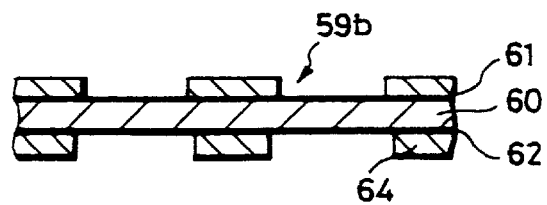
FIGS. 13A to 13E are process diagrams illustrating the configuration of another modified example of the fifth embodiment, and the forming process of the same.
Figure 13B:
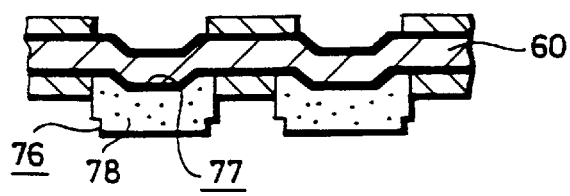
Figure 13C:
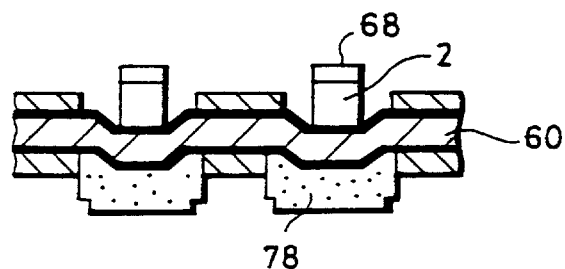
Figure 13D:
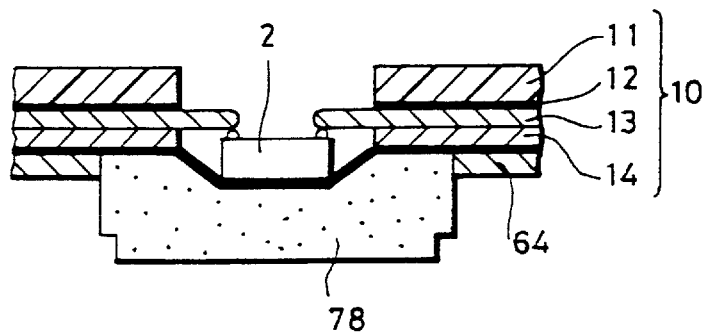
Figure 13E:
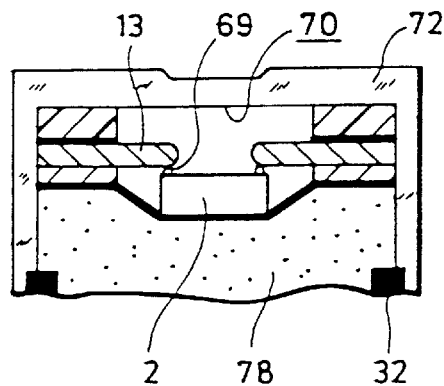

As is obvious from FIG. 13B, the example of FIGS. 13A to 13E is different from the example of FIG. 11E mainly in that pedestals 78 each of which has a notch 76 and a cavity portion 77 formed in accordance with each semiconductor chip 2 are used in the example of FIGS. 13A to 13E. Further, as is obvious from FIG. 13D, the example of FIGS. 13A to 13E is different from the example of FIG. 11E mainly in that the solder resist 14 side of the TAB tape 10 is bonded to the front surface side of the pressure sensitive adhesive double coated tape 59b in the example of FIGS. 13A to 13E. FIG. 13E shows the condition in which a plastic lid 72 is put and bonded to each pedestal 78 with an adhesive agent 32.

In the aforementioned semiconductor device (solid state image pickup device) shown in each of the examples of FIGS. 11A to 11F, FIGS. 12A and 12B and FIGS. 13A to 13E, after semiconductor chips 2 and respective pedestals 21 (78) are bonded correspondingly to each other so as to be opposite to the two surfaces of a pressure sensitive adhesive double coated tape 59b, a TAB tape 10 is bonded to the semiconductor chip 2 side through a base film 11 or a solder resist 14 and at the same time inner leads 13 are connected to the front surface of the semiconductor chip 2 through bumps 69. Further, a plastic lid 72 having a cavity portion 70 is put on each pedestal 21 (78) having the semiconductor chip 2 arranged thereon. Then, an adhesive agent 32 is applied to a gap between the plastic lid 72 and the pedestal 21 (78) so that the plastic lid 72 is bonded to the pedestal 21 (78). Accordingly, the semiconductor chip 2 and the inner leads 13 and base film 11 (solder resist 14) of the TAB tape 10 are bonded and fixed to the pedestal 21 (78). As a result, the movement of the semiconductor chip 2 at the time of sealing with resin in the prior art described previously with reference to FIG. 2 is prevented, so that the breaking of the inner leads 13 is avoided. Accordingly, even in the case where the TAB tape 10 is used, a semiconductor device having a hollow package structure using a plastic lid 72 and excellent in strength can be produced at low cost.

Figure 2:
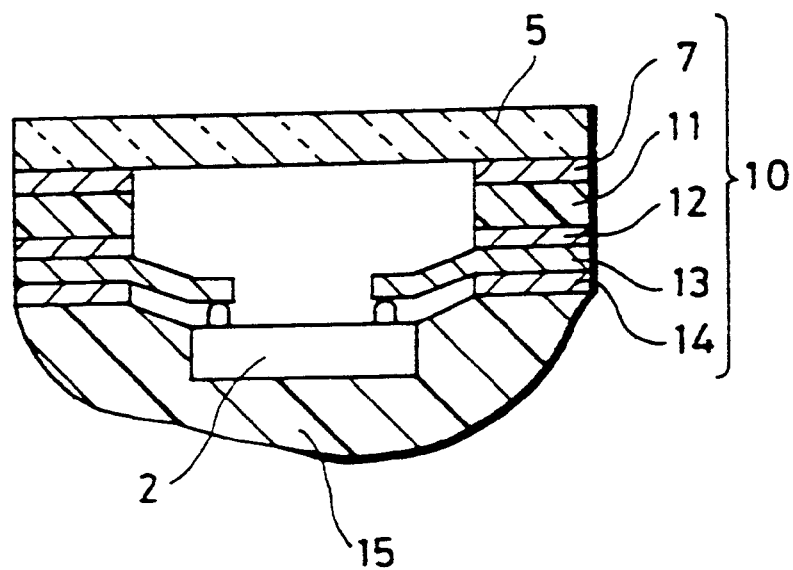
FIG. 2 is a schematic diagram illustrating the configuration of another conventional semiconductor device.

Further, compared with the prior art shown in FIG. 2, the flatness between the front surface of the semiconductor chip 2 and the plastic lid 72 does not change. When, for example, the semiconductor chip 2 is used as a solid state image pickup device such as a CCD area sensor or the like, there is no optical blooming. Further, in the case where a UV radiation setting adhesive agent or a visible radiation setting adhesive agent is used as the adhesive agent 32, the curing time at the time of adhesion can be shortened. Further, because the UV radiation can be structurally performed from another surface than the front surface of the semiconductor chip, for example, from the back surface side of the semiconductor chip, problems in potential shifting due to charging-up, decoloration of a color filter, and so on, caused by the UV radiation are solved thoroughly in the case where the semiconductor chip 2 is used as an image pickup device such as a CCD area sensor or the like. There is a further advantage that the distance between the front surface of the semiconductor chip 2 and the inner surface of the plastic lid 72 can be fixed accurately.

Figure 14A:
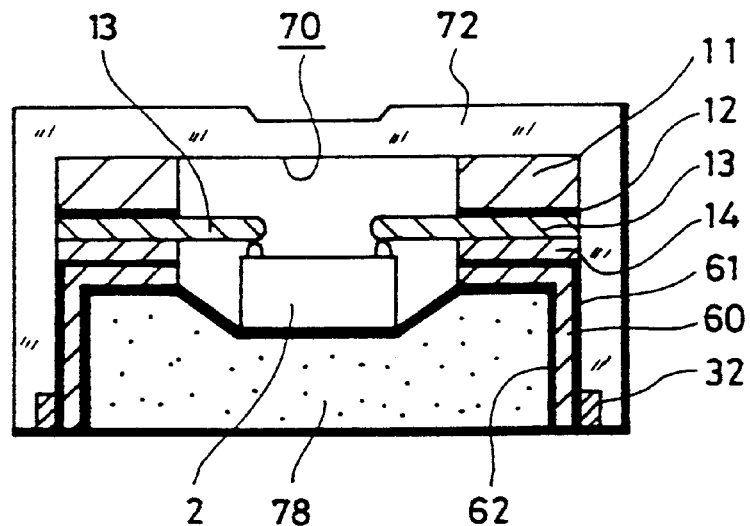
FIGS. 14A and 14B are schematic diagrams illustrating the configuration of another modified example of the fifth embodiment.
Figure 14B:
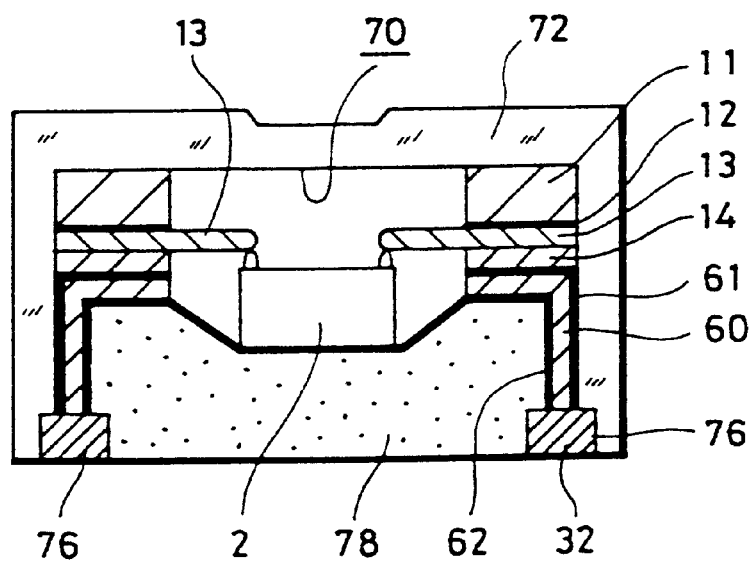

FIGS. 14A and 14B show configurations of modified examples of the semiconductor device shown in FIGS. 11A to 11F, FIGS. 12A and 12B and FIGS. 13A to 13E.

FIG. 14A shows an example in which a base film 60 coated with adhesive agent layers 61 and 62 of a pressure sensitive adhesive double coated tape 59b is extended up to the lower portion of the side surface of a pedestal 78 without cutting. In FIG. 14A, a plastic lid 72 is bonded to the pedestal 78 through the adhesive agent layer 61, the base film 60 and the adhesive agent layer 62. Accordingly, even in the case where the plastic lid 72 is turned over when it is bonded to the pedestal 78 with the adhesive agent 32, the plastic lid 72 is prevented from falling off from the pedestal 78. As a result, the effect of adhesion of the adhesive agent 32 can be improved.

FIG. 14B shows an example in which a base film 60 with adhesive agent layers 61 and 62 of a pressure sensitive adhesive double coated tape 59b is extended up to the position of a notch 76 on the side surface of a pedestal 78 without cutting. Like FIG. 14A, in FIG. 14B, a plastic lid 72 is prevented from falling off from the pedestal 78 even in the case where the plastic lid 78 is turned over when it is bonded to the pedestal 78 with an adhesive agent 32. As a result, the effect of adhesion of the adhesive agent 32 can be improved so that the coating characteristic of the adhesive agent 32 can be improved.

Sixth Embodiment: Example of Forming Optical Low-pass Filter

Figure 15A:
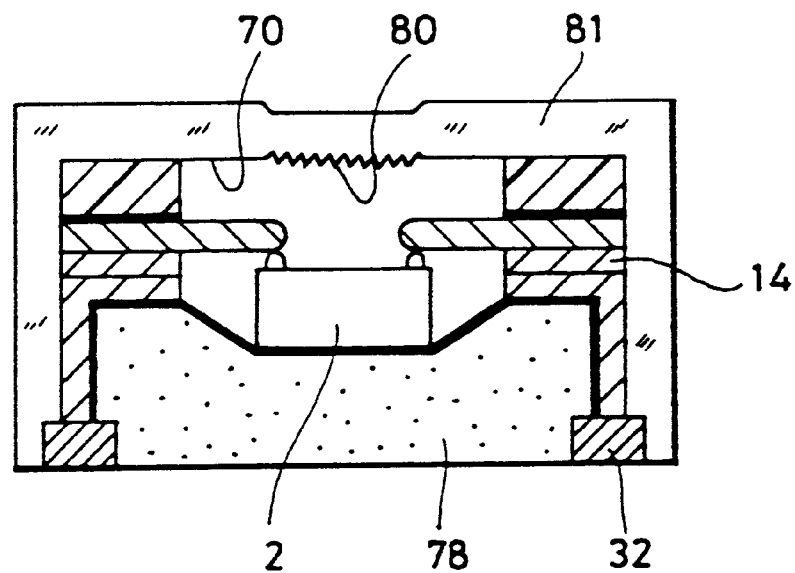
FIGS. 15A and 15B are schematic diagrams illustrating the configuration of a sixth embodiment.
Figure 15B:
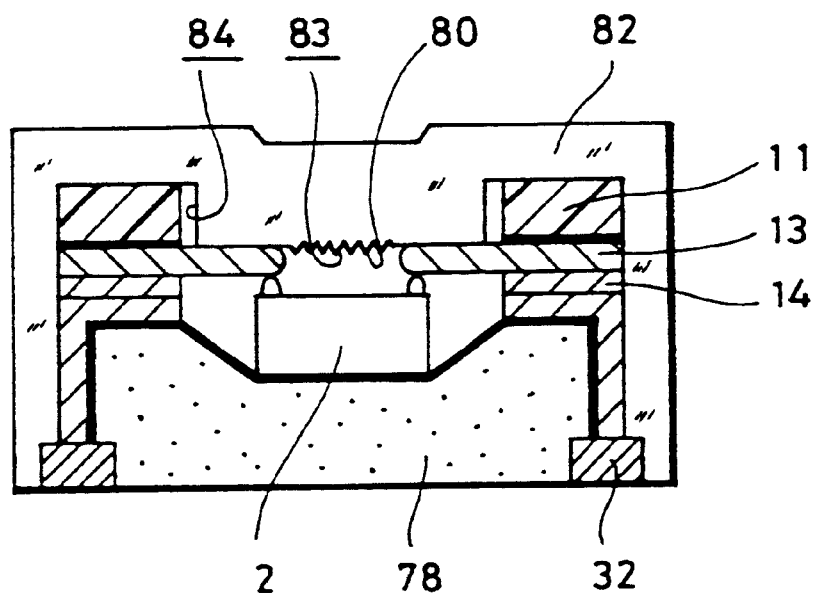

FIGS. 15A and 15B show examples of the configuration of the semiconductor device using the TAB method, in which an optical low-pass filter (hereinafter referred to as "low-pass filter" simply) is formed on a surface of a plastic lid opposite a semiconductor chip.

FIG. 15A shows an example of the configuration of the semiconductor device obtained by replacing the plastic lid 72 of the semiconductor device shown in FIG. 14B by a plastic lid 81 having a low-pass filter 80 formed on the bottom portion of cavity portion of the lid 81.

FIG. 15B shows another example of the configuration of the semiconductor device obtained by replacing the plastic lid 72 of the semiconductor device shown in FIG. 14B by a plastic lid 82 having a low-pass filter 80 formed in the bottom portion of a cavity portion 83 of the lid 82. In FIG. 15B, a groove 84 having a depth corresponding to the thickness of a base film 11 of a TAB tape 10 is formed in the circumference of the bottom portion of the cavity portion 83 so that inner leads 13 are brought into contact or near contact with the surface on which the low-pass filter 80 is formed to thereby control the distance between the front surface of the semiconductor chip 2 and the plastic lid 82 (the surface on which the low-pass filter 80 is formed). In addition, damage can be prevented from α rays generated from the polyimide resin base film 11.

In each of FIGS. 15A and 15B, a low-pass filter can be formed at low cost compared with the case of using a quartz low-pass filter mounted on the outside.

It is known that the low-pass filter 80 may be formed by forming a diffraction grating on the bottom portion of the cavity portion 70/83 of the plastic lid 81/82 through patterning on a mold for injection molding.

In each of FIGS. 15A and 15B, both the parallelism and distance between the surface of the low-pass filter 80 and the front surface of the semiconductor chip 2 must be adjusted with high accuracy.

FIGS. 16A to 16D are diagrams for explaining examples of the method for adjusting the parallelism and distance between the low-pass filter 80 and the front surface of the semiconductor chip 2 in the semiconductor device shown in FIG. 15B.

FIG. 16A is a partly cutaway enlarged sectional view (taken by magnifying power being set suitably for respective parts) showing a plastic lid 82 having a low-pass filter 80 formed thereon put on the pedestal 78 side.

FIG. 16B shows the configuration of the low-pass filter 80 formed by injection molding. In FIG. 16B, a diffraction grating pattern 80a is formed in the center portion and alignment "+" marks 80b to 80e are formed in the four corners.

FIG. 16C shows the configuration of the front surface of the semiconductor chip 2. In FIG. 16C, an effective pixel (photoelectric transfer element) region 2a corresponding to the diffraction grating pattern 80a is formed and alignment "+" marks 2b to 2e corresponding to the alignment marks 80b to 80e are formed in the four corners.

FIG. 16D shows the configuration of an apparatus for carrying out the method of adjusting the parallelism and distance between the front surface of the semiconductor chip 2 and the low-pass filter 80.

That is, first, the plastic lid 82 put on the pedestal 78 is turned over together with the pedestal 78 so as to be set on a fixing jig 85. At this time, the front surface side of the plastic lid 82 is vacuum-sucked toward the fixing jig 85 in the direction of arrow through holes 86 provided in the fixing jig 85, so that the plastic lid 82 is fixed to the fixing jig 85. Further, the gap formed between the plastic lid 82 and the side surface of the pedestal 78 is filled with the aforementioned UV radiation setting or visible radiation setting adhesive agent 32 (which has been not subjected to curing yet).

On the other hand, the bottom surface of the pedestal 78 is vacuum-sucked by four tubes 87 which are movable in up/down directions (in the direction of arrows Y) individually or interlockingly. In this case, portions joined with the pedestal 78 except the plastic lid 82 are vacuum-sucked. Because the four tubes 87 are arranged in the apices of a quadrangle, only two tubes appear in the drawing.

In this condition, the alignment marks 2b to 2e on the semiconductor chip 2 and the alignment marks 80b to 80e on the low-pass filter 80 are adjusted successively (for example, in the order of a combination of 2b and 80b, a combination of 2c and 80c, a combination of 2d and 80d and a combination of 2e and 80e) by four alignment fiber scopes 89 arranged in the fixing jig 85 side so that the distance between alignment marks corresponding to each other is set to a predetermined value, for example, 120 µm. The adjustment of the distance is performed by moving the vacuum-sucked pedestal 78 through the four tubes 87 with measurement carried out by Z-axis adjusting mechanisms of the respective fiber scopes 89.

In the condition in which all the distances between the corresponding four pairs of alignment marks 2b to 2e and 80b to 80e are set to 120 µm, UV or visible light is radiated onto the adhesive agent 32 to cure the adhesive agent 32 to thereby fix/seal the pedestal 78 and the plastic lid 82 to each other. In this manner, the parallelism and distance between the low-pass filter 80 and the front surface of the semiconductor chip 2 are adjusted.

It is a matter of course that the low-pass filter is not limited to the examples shown in FIGS. 15A and 15B and that the low-pass filter may be applied to any of all other embodiments of the semiconductor device having a plastic lid.

Seventh Embodiment: Example of Metal Pedestal TAB Method

FIGS. 17A to 17F show a process for forming a semiconductor device of the seventh embodiment and a configuration thereof.

Figure 17A:
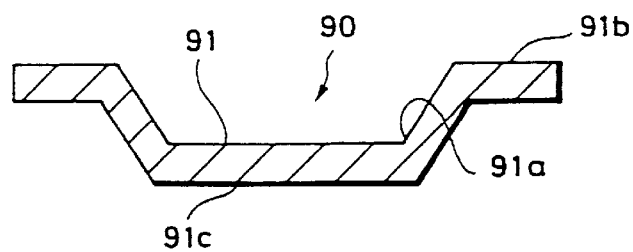
FIGS. 17A to 17F are process diagrams illustrating the configuration of a seventh embodiment and the process of forming of the same.

As shown in FIG. 17A, a metallic pedestal 90 is prepared first. An about 0.5 mm-deep cavity portion 91 having tapering surfaces 91a in its side surfaces is formed in the pedestal 90. As a material for the pedestal 90, Al, Cu or the like may be used. The thickness of the pedestal 90 is about 0.3 mm. The material for the pedestal 90 may be selected from the aforementioned materials having good heat conductivity to improve the heat sinking effect and having good electrical conductivity to stabilize the potential (e.g., earth potential) of a substrate for the semiconductor chip 2 when necessary.

Figure 17B:
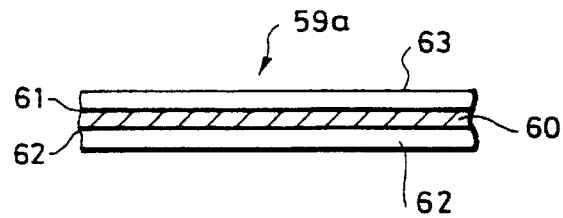

FIG. 17B is a view showing the pressure sensitive adhesive double coated tape 59a shown in FIG. 10A, again.

Figure 17C:
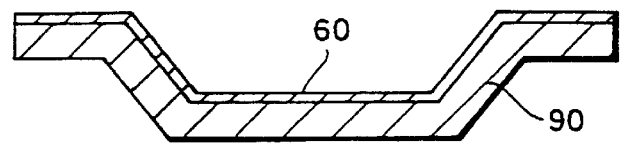

As shown in FIG. 17C, after the release sheet 62 on one surface of the pressure sensitive adhesive double coated tape 59a is released, the pressure sensitive adhesive double coated tape 59a is bonded to a range of from the surface of formation of the cavity portion 91 of the pedestal 90 to the front surface side marginal portion 91b (see FIG. 17A). After sticking, the remaining release sheet 63 is released.

Figure 17D:
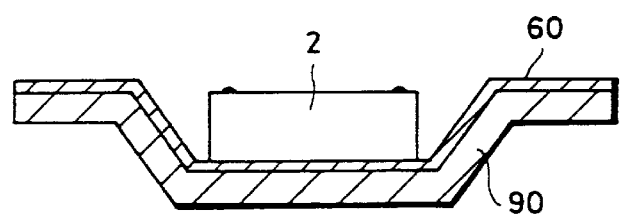

Then, as shown in FIG. 17D, the semiconductor chip 2 having a thickness (about 0.5 mm) corresponding to the depth of the cavity portion 91 is die-bonded to the pedestal 90 side.

Figure 17E:
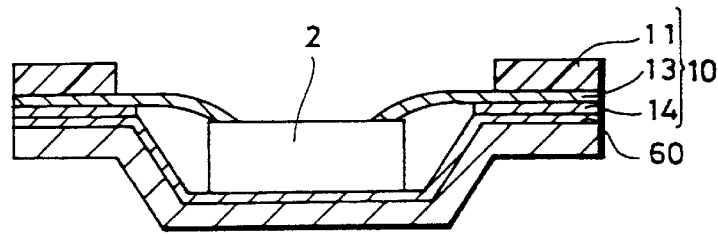

Then, as shown in FIG. 17E, after the TAB tape 10 is put on the front surface marginal portion 91b of the pedestal 90 with the solder resist 14 side faced down, the TAB tape 10 is bonded to the pedestal 90. Thereafter, the semiconductor chip 2 is bonded to the inner leads 13 by single point bonding.

Figure 17F:
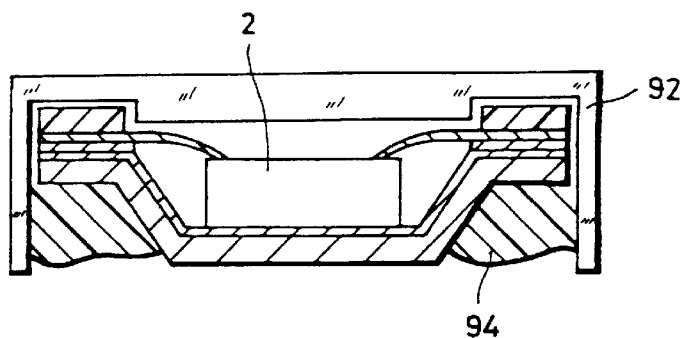

Then, as shown in FIG. 17F, after the plastic lid 92 is put on the pedestal 90, the plastic lid 92 is turned over together with the pedestal 90 and portions of the pedestal 91 except the back surface bottom portion 91c are filled with a thermosetting resin (or adhesive agent) 94. The resin (or adhesive agent) 94 is cured so that the semiconductor chip 2 is sealed. Alternatively, a UV radiation setting or visible radiation setting adhesive agent may be used as the resin 94.

In the example shown in FIG. 17F, the heat sinking effect of the semiconductor device (solid state image pickup device) is improved.

Figure 18:
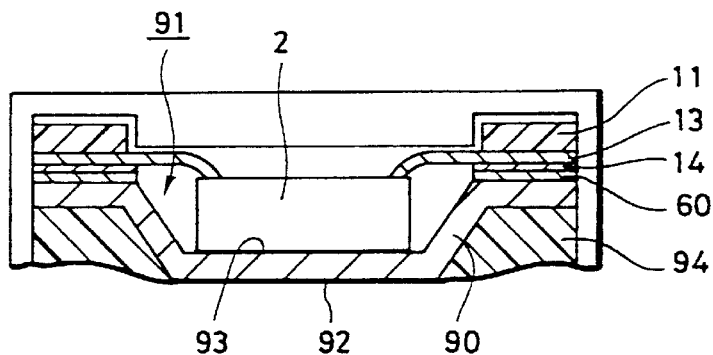
FIG. 18 is a schematic diagram illustrating the configuration of a modified example of the seventh embodiment.

FIG. 18 shows the configuration of a modified example of the semiconductor device shown in FIG. 17F. In FIG. 18, the pressure sensitive adhesive double coated tape 59a is bonded only to the front surface marginal portion 91b (see FIG. 17A) of the pedestal 90 (but is not stuck to the cavity portion 91 (see FIG. 17A) inclusive of the tapering surface 91a). In the back surface bottom portion 91c (see FIG. 17A) of the pedestal, an electrical conductive layer 92 is formed by plating with Sn or solder in advance. This is for the purpose of mounting the semiconductor device onto a printed wiring substrate not shown or the like. Accordingly, the semiconductor device may be connected directly to the printed wiring substrate by using cream solder if necessary. Further, a heat insulating plate may be mounted onto the back surface bottom portion 91c through paste.

Further, in the example of FIG. 18, after electrical conductive paste is applied between the bottom surface portion of the cavity portion 91 of the pedestal 90 and the back surface of the semiconductor chip 2, that is, between the bottom surface portion of the cavity portion 91 and the substrate, the paste is cured at about 100° C. for about 1 hour to thereby form an electrical conductive layer 93. Above all, in the example of FIG. 18, by mounting onto the printed wiring substrate through the electric conductive layer 92, the substrate of the semiconductor chip 2 is electrically connected to the earth potential or the like. As a result, stabilization of the earth potential is attained. In addition, there is then the advantage that the heat sinking effect is improved more greatly compared with the case of FIG. 17F.

The semiconductor device using the metal pedestal TAB method shown in FIG. 18 can be applied not only to a hollow structure semiconductor device such as a solid state image pickup device having a plastic lid but to a general semiconductor device.

Figure 19A:
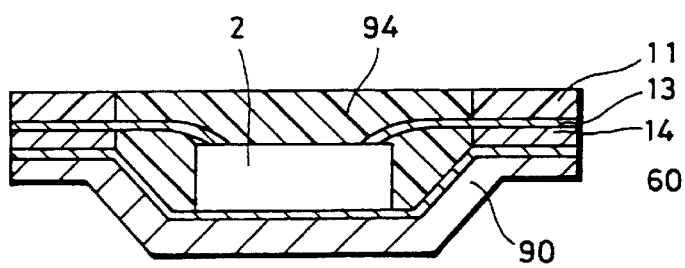
FIGS. 19A and 19B are schematic diagrams illustrating the configuration of another modified example of the seventh embodiment.
Figure 19B:
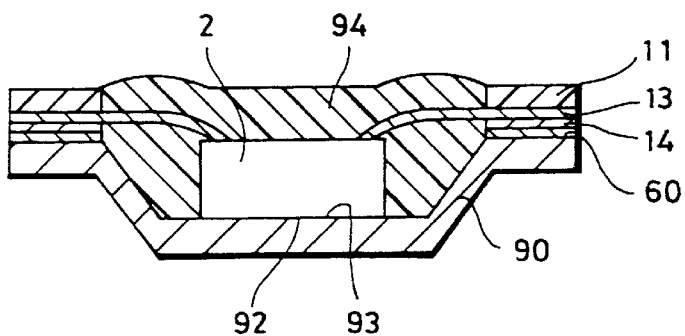

FIGS. 19A and 19B show examples of the structure of such a general semiconductor device. FIG. 19A corresponds to FIG. 17F. FIG. 19B corresponds to FIG. 18. In each of FIGS. 19A and 19B, the whole surface (the whole of the front surface) of the semiconductor chip 2 except the back surface thereof is filled with a thermosetting resin 94 so that the resin 94 is used in place of the plastic lid 92.

Figure 20A:
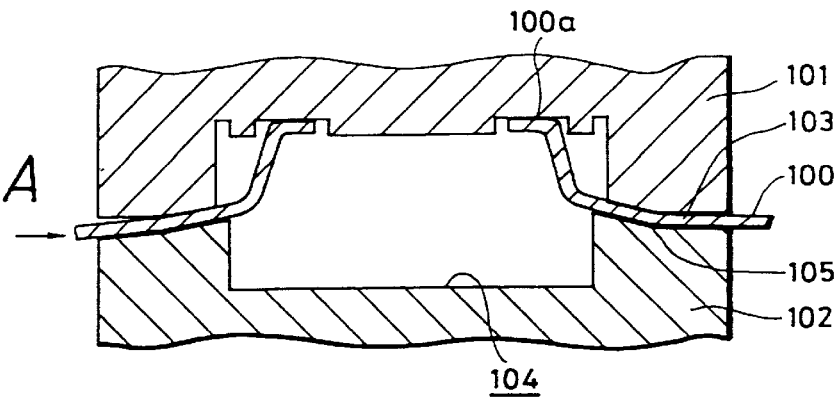
FIGS. 20A to 20E are process diagrams illustrating the configuration of an eighth embodiment and the process of forming of the same.

Eighth Embodiment: Example of Use of Molds for forming an Integrated Molding of Pedestal and Lead Frames FIG. 20A shows the condition in which lead frames 100 are sandwiched between an upper mold 101 and a lower mold 102 for injection molding. A cavity 104 is formed between the upper mold 101 and the lower mold 102. As is apparent from FIG. 20A, a taper 105 is formed in a gap 103 between the upper mold 101 and the lower mold 102 for sandwiching each of the lead frames 100 so that the taper 105 extends in the ascending direction from the outside of the molds toward the inside thereof. The taper 105 is formed so that the inner lead 100a of each of the lead frames 100 is brought into contact with the upper inner surface of the upper mold 101 securely by the spring characteristic of the lead frame 100.

Under the condition shown in FIG. 20A, a molten thermoplastic resin is injected (pushed) into the cavity 104 from the direction of the arrow by a plunger not shown. The resin pushed into the cavity 104 is cooled so as to be solidified by the upper mold 101 and the lower mold 102. Because the inner lead 100a is in close contact with the inner surface of the upper mold 101 in this case, the resin never goes around on the contacting surface between the inner lead 100a and the upper mold 101.

Figure 20B:
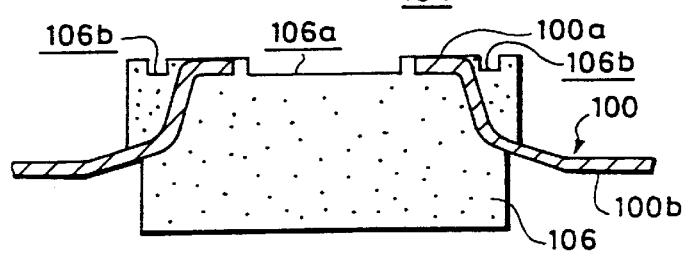

FIG. 20B shows the configuration of the integrated molding (integrated molding pedestal) of the pedestal 106 and the lead frames 100 in the case where the upper mold 101 and the lower mold 102 are removed after the resin is solidified to form the pedestal 106.

As is apparent from FIG. 20B, the integrated molding is formed so that the upper surfaces of the inner leads 100a are disposed in the upper portion of the pedestal 106, the intermediate portions of the lead frames 100 are buried in the pedestal 106 and the outer leads 100b are projected from the pedestal 106 to the outside. A cavity portion 106a corresponding to the semiconductor chip 2 and a groove portion 106b engaged with the projection portion of the plastic lid as will be described later are formed in the upper surface of the pedestal 106.

Figure 20C:
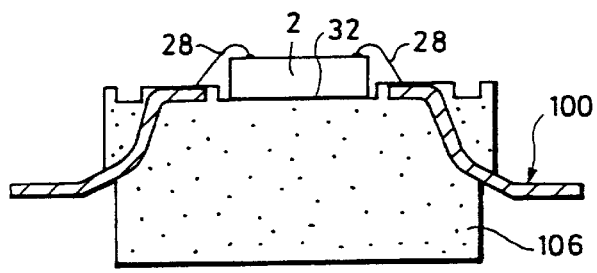

Then, as shown in FIG. 20C, the semiconductor chip 2 is die-bonded to the upper surface cavity portion 106a of the pedestal 106 with the adhesive agent 32 and then the semiconductor chip 2 is wire-bonded to the inner leads 100a with gold wires 28. As for the kind of the adhesive agent 32, for example, an anaerobic UV radiation setting or visible radiation setting adhesive agent may be used. The condition of radiation for curing the adhesive agent is about 500 mJ/cm². The temperature of the chip at the time of wire bonding is about 100° C. and the diameter of the gold wire 28 is in a range of from Φ23 to 25 μm.

Figure 20D:
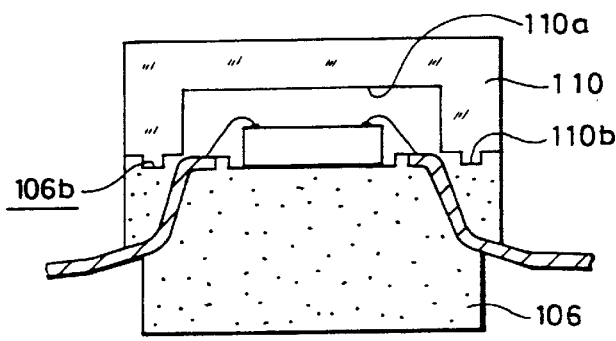

Then, as shown in FIG. 20D, a plastic lid 110 having a cavity portion 110a is put on the pedestal 106 so that the marginal projection portion 110b of the plastic lid 110 is fitted into the groove portion 106b of the pedestal. As a result, the pedestal 106 and the plastic lid 110 are fixed to each other.

In the case that the plastic lid 110 is formed of a thermoplastic resin and the pedestal 106 is formed of the same thermoplastic resin, the aforementioned fixing treatment can be carried out through the thermoplastic resin melted by the ultrasonic fusing method. In the case where the plastic lid 110 is formed of another resin such as a thermosetting resin than the thermoplastic resin, the aforementioned UV radiation setting or visible radiation setting adhesive agent may be used.

Figure 20E:
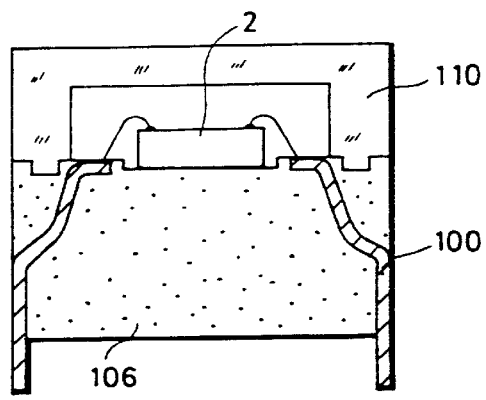

Then, as shown in FIG. 20E, the lead frames 100 are bent along the side surfaces of the pedestal 106 and cut into a suitable length to finish a hollow structure semiconductor device having a plastic lid.

Figure 21:
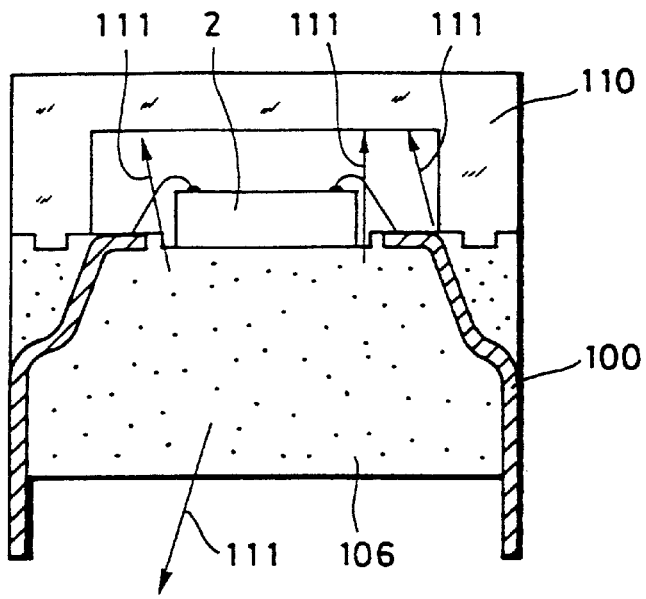
FIG. 21 is a schematic diagram for explaining the operation of the eighth embodiment.

FIG. 21 is a diagram for explaining the operation of the semiconductor device (solid image pickup device) shown in FIG. 20E. In FIG. 21, α rays 111 are generated from the pedestal 106 as represented by the arrow. The reason why α rays 111 are generated is that the pedestal 106 contains glass substrate fillers such as glass beads, glass fiber, or the like. No α rays are generated from the plastic lid 110.

Because in this case the joint surface between the pedestal 106 and the plastic lid 110 is located at a level lower than the front surface of the semiconductor chip 2, α rays 111 are not radiated onto the joint surface even in the case where α rays 111 are generated. Accordingly, no damage due to α rays 111 occurs in the semiconductor chip 2.

Figure 22:
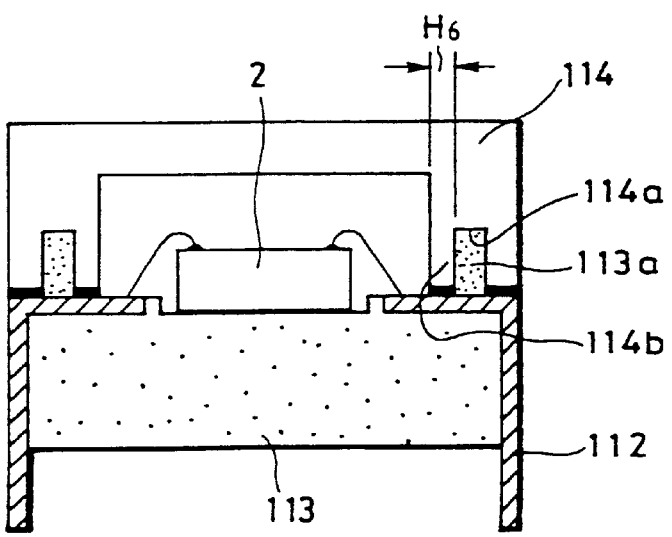
FIG. 22 is a schematic diagram illustrating the configuration of a modified example of the eighth embodiment.

FIG. 22 shows the configuration of a modified example of the semiconductor device shown in FIG. 20F. Linear lead frames which are shaped like a line before they are bent at right angles are used as lead frames 112 in order to reduce the cost. A pedestal 113 is formed by injection molding. The linear lead frames 112 and the pedestal 113 are formed as an integral product by injection molding. After die bonding and wire bonding treatments are carried out, a plastic lid 114 is put on the pedestal 113 and fixed thereto. Then, the lead frames 112 are bent at right angles along the side surfaces of the pedestal 113 and cut off to finish a semiconductor device (solid state image pickup device) shown in FIG. 22.

In the example of FIG. 22, projection portions 113a are provided along the upper surface marginal portion of the pedestal 113 whereas cavity portions 114a corresponding to the projection portions 113a are provided in the plastic lid 114. Each of the projection portions 113a has a height in a range of from 0.9 to 1.0 mm and a width of from 0.5 to 0.6 mm. The thickness $H_6$ of the semiconductor chip 2 side edges 114b corresponding to the projection portions 113a is preferably selected to be in a range of from 0.3 to 0.5 mm from the view of injection molding and under the consideration of mechanical strength. Because the thickness $H_6$ of the edges 114b required for shading α rays generated from the projection portions 113a is not smaller than 0.1 mm, the thickness $H_6$ selected to be in the aforementioned range is sufficient.

It is a matter of course that the present invention is not limited to the aforementioned embodiments and that various constructions may be employed in the present invention without departing from the gist of the present invention. For example, the present invention may be applied to a UV erasing type EPROM.

As has been described, according to the present invention, a plastic lid having a cavity portion is put on a pedestal on which a semiconductor chip is mounted, and an adhesive agent is charged into the space between the plastic lid and the pedestal to bond the plastic lid with the pedestal. Accordingly, no window frame is required. The plastic lid does not require corona discharge treatment or the like. Accordingly, it is not necessary to use a B-stage thermosetting adhesive agent, so that it is possible to manufacture a semiconductor device of a hollow package configuration having a plastic lid at a low cost. Since a window frame is not used, there is no problem on the characteristics of seal glass with respect to a semiconductor chip due to the inclination of the window frame. Accordingly it is possible to reduce the cost of the pedestal per se. For example, in the case of using a UV radiation setting adhesive agent or a visible radiation setting adhesive agent as the adhesive agent, it is possible to achieve the effect that cure time in bonding can be reduced. UV radiation can be performed from a surface other than the surface of the semiconductor chip, for example, from the back surface. Accordingly, in the case where the semiconductor chip is an image pickup device such as a CCD area sensor or the like, it is possible to obtain an effect that there are not any problems such as potential shift, discoloration of color filters and so on caused by charge-up due to the UV radiation.

Further according to the present invention, after a semiconductor chip and a pedestal are bonded respectively to the opposite surfaces of a pressure sensitive adhesive double coated tape so as to be opposite to each other, a TAB tape is bonded to the surface of the semiconductor chip through a base film or a solder resist, and inner leads are connected to the surface of the semiconductor chip. Further a plastic lid having a cavity portion is made to cover the pedestal on which the semiconductor chip is mounted, and an adhesive agent is charged into the space between the plastic lid and the pedestal to bond the plastic lid with the pedestal. Accordingly, it is possible to manufacture a semiconductor device of a hollow package configuration having a plastic lid superior in strength at a low cost even if a TAB tape is used. More in detail, as a result, the semiconductor chip and the inner lead and base film of the TAB tape are bonded and fixed onto the pedestal, so that there is no case where the inner lead is broken, and there is no case where the parallelism between the surface of the semiconductor chip and the plastic lid is changed. Accordingly, for example, in the case where the semiconductor chip is a solid state image pickup device such as a CCD area sensor or the like, it is possible to obtain an effect that the sharpness of optical focus does not deteriorate.

For example, in the case where a UV radiation setting adhesive agent or a visible radiation setting adhesive agent is used as the adhesive agent, it is possible to reduce cure time in bonding. UV radiation can be performed from a surface other than the surface of the semiconductor chip, for example, from the back surface. Accordingly, in the case where the semiconductor chip is an image pickup device such as a CCD area sensor or the like, it is possible to obtain an effect that there are not any problems such as potential shift, discoloration of color filters and so on due to charge-up caused by the UV radiation.

The present invention also has an advantage that it is possible to control the distance between the surface of the semiconductor chip and the inner surface of the plastic lid to be fixed accurately.

Further, according to the present invention, a step portion is formed in a circumferential portion of the cavity portion of the plastic lid, and at a level lower than the surface of the semiconductor chip. Therefore, a space is formed between this step portion and a side portion of the pedestal. Since an adhesive agent is charged or put into the space, there is no case that gas released at the time of cure of the adhesive agent enters into the inside of the hollow portion. Accordingly, it is possible to obtain an effect to prevent such a trouble that the released gas adheres onto the inside of the plastic lid in the hollow portion or onto an effective pixel region of the surface of the semiconductor chip such as a CCD area sensor or the like so as to produce unevenness of sensitivity and deterioration of quality. Further, if dust is produced by rubbing at the time of covering the pedestal with the plastic lid, the dust is held in the step portion and fixed by the adhesive agent. Accordingly it is possible to obtain an effect to prevent defects caused by dust from occurring.

Further, according to the present invention, a bonding portion of the plastic lid and the pedestal is located at a level lower than the surface of the semiconductor chip. Accordingly, it is possible to obtain an effect that gas released at the time of cure of an adhesive agent hardly enters the inside of the hollow. Accordingly, it is possible to obtain an effect that the released gas hardly adheres onto the inside of the plastic lid in the hollow or onto an effective pixel region of the surface of the semiconductor chip such as a CCD area sensor or the like so as to produce unevenness of sensitivity and deterioration of quality.

Further, according to the present invention, if a bonding portion where the plastic lid is bonded to the lead frame is located at a level higher than the surface of the semiconductor chip, the plastic lid is partly interposed between the bonding portion and the surface of the semiconductor chip. Accordingly, also in this case, it is possible to shield $\alpha$ rays from the adhesive agent by the above-mentioned interposed portion, so that it is possible to obtain an effect that there is not any damage by $\alpha$ rays in the semiconductor chip.

Further, according to the present invention, a bonding portion of the pedestal and the plastic lid is further sealed with a sealing member. Accordingly it is possible to obtain an effect that higher air-tightness can be attained.

Further, according to the present invention, outer lead portions (connection terminal portions) of the TAB tape is led out of the semiconductor device in one direction. Accordingly, it is possible to obtain an effect that it is easy to mount the semiconductor device onto a printed circuit board or the like.

Further, according to the present invention, an optical filter is formed on the surface of said plastic lid which is opposite to the surface of the semiconductor chip. Accordingly it is possible to obtain an effect that the filter can be formed at a low price in comparison with an external crystal low pass filter.

Further, according to the present invention, the distance between the respective alignment marks of the optical filter and the semiconductor chip is measured by an Z-axis adjustment mechanism of fiberscope so as to adjust the distance between the surface of the semiconductor chip and the optical filter formation surface, and thereafter the plastic lid is stuck to the pedestal by an adhesive agent. Accordingly, it is possible to achieve the effect that the distance and parallelism between the surface of the semiconductor chip and the optical filter can be set easily and accurately.

Further, according to the present invention, outer lead portions (connection terminal portions) of the TAB tape are led out of the semiconductor device in one direction. Accordingly, it is easy to mount the semiconductor device onto a printed circuit board or the like.

Further, according to the present invention, a semiconductor chip is disposed in a front-surface side bottom portion of a pedestal having a cavity-like section, and a TAB tape is put onto a front-surface side circumferential portion of the pedestal through a pressure sensitive adhesive double coated tape. The semiconductor chip is sealed by charging and setting a thermoplastic resin around the semiconductor chip after bonding inner lead portions of the TAB tape with pad portions of the semiconductor chip. Accordingly, it is possible to manufacture a semiconductor device with a simple configuration. It is therefore possible to improve a heat radiation effect if a back-surface side bottom portion of the pedestal is attached to a patterned surface of a printed-circuit board or the like.

Further, in a semiconductor device of a hollow package structure in which a plastic lid is bonded by an adhesive agent onto a lead-frame-incorporated pedestal molded by a mold according to the present invention, inner leads of the lead frames surely contact with an upper mold. Accordingly, there is no case where resin turns onto bonding surfaces of the inner leads. Thus, the semiconductor device is superior in reliability. In addition, in the configuration where the surface of a semiconductor chip is disposed at a level higher than the bonding surface between the plastic lid and the pedestal, it is possible to prevent the performance of the semiconductor chip from being deteriorated due to α rays from the pedestal. Further, in the case that the surface of the semiconductor chip is disposed at a level lower than the bonding surface between the plastic lid and the pedestal, the plastic lid is partly interposed between the pedestal and the surface of the semiconductor chip. Accordingly, in the same manner, it is possible to prevent the performance of the semiconductor chip from being deteriorated due to α rays.

Having described preferred embodiments of the invention with reference to the drawings, it is to be understood that the invention is not limited to those precise embodiments and that various modifications and variations could be effected therein by one skilled in the art without departing from the spirit or scope of the invention as defined in the appended claims.

What is claimed is:

1. A CCD semiconductor device comprising:
    a pedestal having a CCD semiconductor chip mounted on a top surface of said pedestal;
    leads with portions thereof disposed on said top surface of said pedestal, said portions being connected to said CCD semiconductor electrically; and
    a plastic lid having a transparent central portion, a side wall substantially perpendicular to a plane of the transparent central portion, the side wall having at least a first indentation presenting an edge surface substantially parallel to the plane of the transparent central portion wherein the indentation in the side wall is located between the transparent central portion and an end of the side wall opposite the transparent central portion and the edge surface is adjacent the leads and the pedestal.

2. A semiconductor device according to claim 1, further comprising a second indentation in the side wall of the plastic lid presenting a second edge surface substantially parallel to the plane of the transparent central portion, thereby providing a gap between the pedestal and the lid, wherein resin fills the gap.

3. A CCD semiconductor device according to claim 2, in which the first indentation which is bonded with said pedestal and said leads is located at a level higher than a surface of said semiconductor chip.

4. A CCD semiconductor device according to claim 1, in which a portion of said plastic lid which is bonded with said pedestal and said lead frames with a adhesive agent is sealed with a sealing member.

5. A CCD semiconductor device according to claim 1, in which an optical filter is formed in the transparent central portion of said plastic lid.

6. A CCD semiconductor device comprising:
    a pedestal and a semiconductor chip bonded respectively on opposite surfaces of a pressure sensitive adhesive double-coated tape;
    a tape of a TAB system bonded onto the surface of said pressure sensitive adhesive double coated tape on which said semiconductor chip is bonded, said TAB system tape having an inner lead connected to a pad portion of said semiconductor chip; and
    a plastic lid having a transparent central portion, a side wall substantially perpendicular to a plane of the transparent central portion, the side wall having at least at first indentation presenting an edge surface substantially parallel to the plane of the transparent central portion, the edge of said plastic lid being bonded to said pedestal with an adhesive agent.

7. A CCD semiconductor device according to claim 6, in which the edge of said plastic lid which is bonded with said pedestal is located at a level lower than a bonding surface of said semiconductor chip.

8. A CCD semiconductor device according to claim 6, in which an outer lead portion of said tab system tape extends out from said semiconductor device.

9. A CCD semiconductor device comprising:
    a pedestal;
    a chip mounted on a top surface of the pedestal;
    a plurality of leads having inner portions on a top surface of said pedestal, said leads extending down a side surface of the pedestal;
    a plastic lid having a transparent central portion located above the chip, said plastic lid having a side wall substantially perpendicular to a plane of the transparent central portion, said side wall having at least a first indentation presenting an edge having a surface substantially parallel to the top surface of the pedestal, said indentation and edge surface mounted adjacent the leads and a portion of the top surface of the pedestal, wherein the indentation is located between the transparent central portion and an end of the side wall.

10. The CCD semiconductor device of claim 9, further comprising a second indentation in the side wall presenting a second edge having a surface substantially parallel to the top surface of the pedestal, the second edge forming a gap between the pedestal and the lid.

* * * * *